(12) United States Patent
Takemura et al.

(10) Patent No.: US 10,692,869 B2
(45) Date of Patent: Jun. 23, 2020

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Yasuhiko Takemura, Atsugi (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/347,744

(22) PCT Filed: Nov. 8, 2017

(86) PCT No.: PCT/IB2017/056970
§ 371 (c)(1),
(2) Date: May 6, 2019

(87) PCT Pub. No.: WO2018/092003
PCT Pub. Date: May 24, 2018

(65) Prior Publication Data
US 2019/0259761 A1    Aug. 22, 2019

(30) Foreign Application Priority Data
Nov. 17, 2016    (JP) .................................. 2016-224037

(51) Int. Cl.
*H01L 27/108*  (2006.01)
*H01L 27/105*  (2006.01)
(Continued)

(52) U.S. Cl.
CPC ........ *H01L 27/1052* (2013.01); *G11C 11/401* (2013.01); *G11C 11/405* (2013.01);
(Continued)

(58) Field of Classification Search
CPC ..................... H01L 27/10811; H01L 27/10855
See application file for complete search history.

(56) References Cited

U.S. PATENT DOCUMENTS

| 8,383,477 | B2* | 2/2013 | Lee | .................. | H01L 27/10852 |
| | | | | | 438/212 |
| 9,312,262 | B2* | 4/2016 | Lee | .................. | H01L 27/10823 |

(Continued)

FOREIGN PATENT DOCUMENTS

| JP | 2011-135065 A | 7/2011 |
| JP | 2012-238870 A | 12/2012 |

(Continued)

OTHER PUBLICATIONS

International Search Report (Application No. PCT/IB2017/056970) dated Jan. 30, 2018.
(Continued)

*Primary Examiner* — George R Fourson, III
(74) *Attorney, Agent, or Firm* — Robinson Intellectual Property Law Office; Eric J. Robinson

(57) ABSTRACT

A semiconductor device with a large storage capacity per unit area is provided. The disclosed semiconductor device includes a plurality of gain-cell memory cells each stacked over a substrate. Axes of channel length directions of write transistors of memory cells correspond to each other, and are substantially perpendicular to the top surface of the substrate. The semiconductor device can retain multi-level data. The channel of read transistors is columnar silicon (embedded in a hole penetrating gates of the read transistors). The channel of write transistors is columnar metal oxide (embedded in a hole penetrating the gates of the read transistors and gates, or write word lines, of the write transistors). The columnar silicon faces the gate of the read transistor with an insulating film therebetween. The columnar metal oxide faces the write word line with an insulating film, which is (Continued)

obtained by oxidizing the write word line, therebetween, and is electrically connected to the gate of the read transistor.

12 Claims, 19 Drawing Sheets

(51) Int. Cl.
*H01L 27/12* (2006.01)
*H01L 49/02* (2006.01)
*H01L 29/66* (2006.01)
*H01L 29/786* (2006.01)
*G11C 11/409* (2006.01)
*G11C 11/405* (2006.01)
*H01L 29/423* (2006.01)
*G11C 11/4094* (2006.01)
*G11C 11/56* (2006.01)
*G11C 11/401* (2006.01)
*H01L 29/49* (2006.01)
*H01L 29/78* (2006.01)

(52) U.S. Cl.
CPC ........ *G11C 11/409* (2013.01); *G11C 11/4094* (2013.01); *G11C 11/565* (2013.01); *H01L 27/10808* (2013.01); *H01L 27/124* (2013.01); *H01L 27/127* (2013.01); *H01L 27/1207* (2013.01); *H01L 27/1225* (2013.01); *H01L 27/1251* (2013.01); *H01L 27/1255* (2013.01); *H01L 28/60* (2013.01); *H01L 29/423* (2013.01); *H01L 29/49* (2013.01); *H01L 29/66969* (2013.01); *H01L 29/7869* (2013.01); *H01L 29/78642* (2013.01); *H01L 29/78696* (2013.01); *H01L 27/10811* (2013.01); *H01L 27/10855* (2013.01); *H01L 29/7833* (2013.01)

(56) References Cited

U.S. PATENT DOCUMENTS

| | | |
|---|---|---|
| 10,056,131 B2 | 8/2018 | Atsumi et al. |
| 2011/0065270 A1 | 3/2011 | Shim et al. |
| 2011/0121286 A1 | 5/2011 | Yamazaki et al. |
| 2011/0128777 A1 | 6/2011 | Yamazaki et al. |
| 2011/0227062 A1 | 9/2011 | Kato et al. |
| 2011/0249484 A1 | 10/2011 | Takemura |
| 2013/0043525 A1* | 2/2013 | Yu ................. H01L 27/10814 257/329 |
| 2013/0070506 A1 | 3/2013 | Kajigaya |
| 2013/0221356 A1 | 8/2013 | Yamazaki et al. |
| 2014/0339546 A1 | 11/2014 | Yamazaki et al. |
| 2016/0027915 A1* | 1/2016 | Kwon, II ............ H01L 29/7841 257/334 |
| 2016/0087107 A1 | 3/2016 | Yamazaki et al. |
| 2016/0225790 A1 | 8/2016 | Yamazaki et al. |
| 2016/0351576 A1 | 12/2016 | Yamazaki et al. |
| 2018/0102157 A1* | 4/2018 | Bedeschi ............ G11C 11/2273 |
| 2019/0393267 A1* | 12/2019 | Pillarisetty ........ H01L 27/10873 |

FOREIGN PATENT DOCUMENTS

| | | |
|---|---|---|
| JP | 2013-065638 A | 4/2013 |
| JP | 2013-211537 A | 10/2013 |
| JP | 2014-212324 A | 11/2014 |
| JP | 2015-005733 A | 1/2015 |
| JP | 2015-065452 A | 4/2015 |
| JP | 2015-170749 A | 9/2015 |
| JP | 2015-216386 A | 12/2015 |
| JP | 2017-028320 A | 2/2017 |
| WO | WO-2011/065258 | 6/2011 |

OTHER PUBLICATIONS

Written Opinion (Application No. PCT/IB2017/056970) dated Jan. 30, 2018.

* cited by examiner

FIG. 19A
FIG. 19B
FIG. 19C
FIG. 19D
FIG. 19E
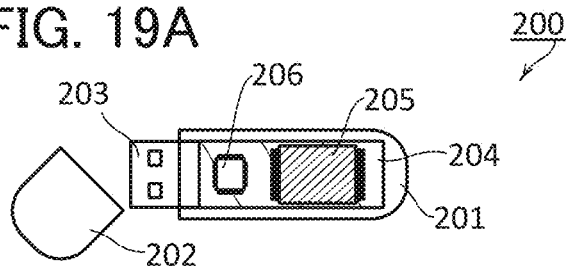
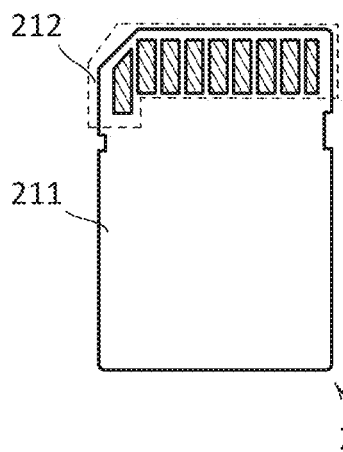
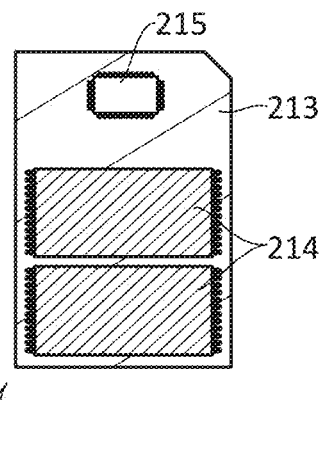
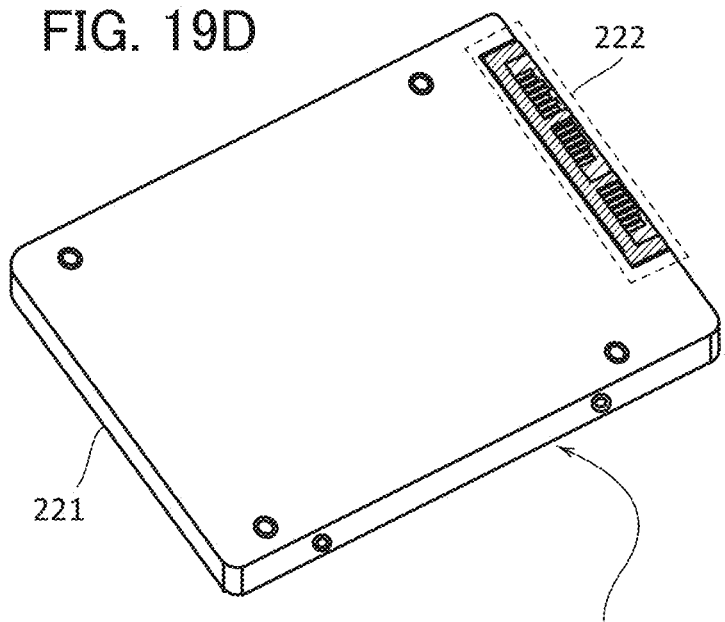
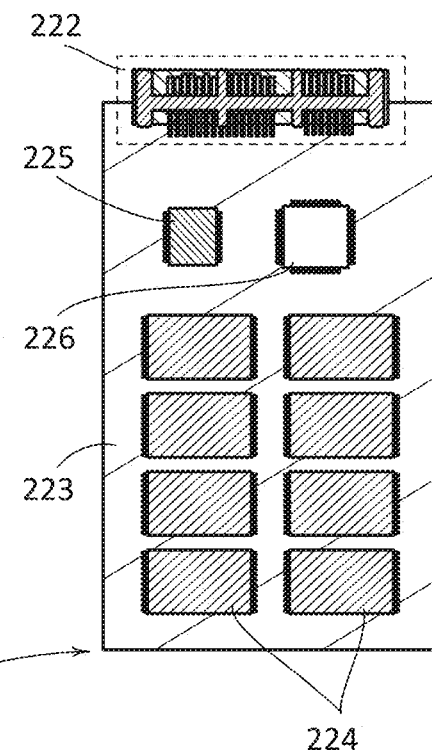

SEMICONDUCTOR DEVICE AND METHOD FOR MANUFACTURING SEMICONDUCTOR DEVICE

TECHNICAL FIELD

The present invention relates to, for example, a transistor or a semiconductor device. The present invention relates to, for example, a method for manufacturing a transistor or a semiconductor device. The present invention relates to a display device, a light-emitting device, a lighting device, a power storage device, a memory device, a processor, or an electronic device, for example. The present invention relates to a method for manufacturing a display device, a liquid crystal display device, a light-emitting device, a memory device, or an electronic device. The present invention relates to a method for driving a display device, a liquid crystal display device, a light-emitting device, a storage device, or an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a storage device, a semiconductor circuit, and an electronic device include a semiconductor device in some cases.

BACKGROUND ART

Much attention has been given to a gain cell semiconductor device that is capable of reading and writing data by using a combination of a transistor in which silicon (Si) is used for a semiconductor layer and a transistor in which a metal oxide is used for a semiconductor layer (see Patent Documents 1 to 3).

In recent years, with the increase in the amount of data dealt with, semiconductor devices having a larger storage capacity have been required. To increase storage capacity per unit area, stacking memory cells is effective (see Patent Document 4). Stacking memory cells can increase storage capacity per unit area in accordance with the number of the stacked memory cells.

REFERENCES

Patent Documents

[Patent Document 1] United States Published Patent Application No. 2011/0121286A1
[Patent Document 2] United States Published Patent Application No. 2011/0227062A1
[Patent Document 3] United States Published Patent Application No. 2011/0249484A1
[Patent Document 4] United States Published Patent Application No. 2011/0065270A1

DISCLOSURE OF INVENTION

An object is to provide a semiconductor device with a large storage capacity per unit area. Another object is to provide a semiconductor device with a novel structure in which memory cells are stacked. Another object is to provide a method for driving a semiconductor device with a novel structure.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first memory cell over a substrate, and a second memory cell over the first memory cell. The first memory cell includes a first transistor, a second transistor, and a first capacitor. The second memory cell includes a third transistor, a fourth transistor, and a second capacitor. A gate of the first transistor is electrically connected to one of a source and a drain of the second transistor. The one of the source and the drain of the second transistor is electrically connected to one electrode of the first capacitor. A gate of the third transistor is electrically connected to one of a source and a drain of the fourth transistor. The one of the source and the drain of the fourth transistor is electrically connected to one electrode of the second capacitor. One of a source and a drain of the first transistor is electrically connected to one of a source and a drain of the third transistor. An axis in a channel length direction of the first transistor corresponds to an axis in a channel length direction of the third transistor. An axis in a channel length direction of the second transistor corresponds to an axis in a channel length direction of the fourth transistor.

Another embodiment of the present invention is a semiconductor device including a first memory cell over a substrate, and a second memory cell over the first memory cell. The first memory cell includes a first transistor, a second transistor, and a first capacitor. The second memory cell includes a third transistor, a fourth transistor, and a second capacitor. A gate of the first transistor is electrically connected to one of a source and a drain of the second transistor. The one of the source and the drain of the second transistor is electrically connected to one electrode of the first capacitor. A gate of the third transistor is electrically connected to one of a source and a drain of the fourth transistor. The one of the source and the drain of the fourth transistor is electrically connected to one electrode of the second capacitor. One of a source and a drain of the first transistor is electrically connected to one of a source and a drain of the third transistor. Channel length directions of the first transistor to the fourth transistor are substantially perpendicular to a top surface of the substrate.

Another embodiment of the present invention is a semiconductor device including a first memory cell over a substrate, and a second memory cell over the first memory cell. The first memory cell includes a first transistor, a second transistor, and a first capacitor. The second memory cell includes a third transistor, a fourth transistor, and a second capacitor. A gate of the first transistor is electrically connected to one of a source and a drain of the second transistor. The one of the source and the drain of the second transistor is electrically connected to one electrode of the first capacitor. A gate of the third transistor is electrically connected to one of a source and a drain of the fourth transistor. The one of the source and the drain of the fourth transistor is electrically connected to one electrode of the second capacitor. One of a source and a drain of the first transistor is electrically connected to one of a source and a drain of the third transistor. The semiconductor device includes a first wiring serving as a gate of the second transistor, an electrode serving as the gate of the first transistor, and a first semiconductor filling a first hole formed to penetrate the first wiring and the electrode. A first insulating film is provided between the first semiconductor and the first wiring. The first semiconductor is electrically connected to the electrode.

An insulator may be provided between the first wiring and the electrode, and may have a property of releasing hydrogen by heating. The electrode may be formed using a material maintaining surface conductivity under a condition where the first insulating film is formed. The electrode may be formed using any one of the following materials: (1) a metal or an alloy that is less likely to be oxidized, (2) a metal or an alloy whose oxide is conductive, (3) a conductive metal oxide, (4) a metal or an alloy whose oxide is more readily reduced than an oxide of the first wiring, and (5) a conductive material that vaporizes when oxidized and does not form an insulating compound on its surface.

The semiconductor device may include a second wiring that faces the electrode with a second insulating film provided therebetween and extends in substantially the same direction as the first wiring, and the first capacitor may be formed by the electrode, the second wiring, and the second insulating film. The first insulating film may be formed by oxidizing the first wiring in a state where the first wiring is supplied with a potential different from that supplied to the electrode.

Another embodiment of the present invention is a method for manufacturing a semiconductor device, including a step of stacking an electrode and a first wiring and forming the first hole penetrating the electrode and the first wiring, a step of forming a second hole penetrating the first wiring, a step of oxidizing the surface of the first wiring facing the first hole, a step of forming a first semiconductor in the first hole, a step of forming a third insulating film on the side of the electrode facing the second hole, and a step of forming a second semiconductor over the third insulating film.

In the above description, the second transistor and the fourth transistor may each include a metal oxide.

One embodiment of the present invention can provide a semiconductor device with a large storage capacity per unit area. One embodiment of the present invention can provide a semiconductor device with a novel structure in which memory cells are stacked. One embodiment of the present invention can provide a driving method for a semiconductor device with a novel structure.

A module including the semiconductor device can be provided. An electronic device including the semiconductor device or the module can be provided. A novel semiconductor device can be provided. A novel module can be provided. A novel electronic device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

In the accompanying drawings:

FIGS. 19A to 19E are schematic views of storage devices according to one embodiment of the present invention.

BEST MODE FOR CARRYING OUT THE INVENTION

Figure 1:
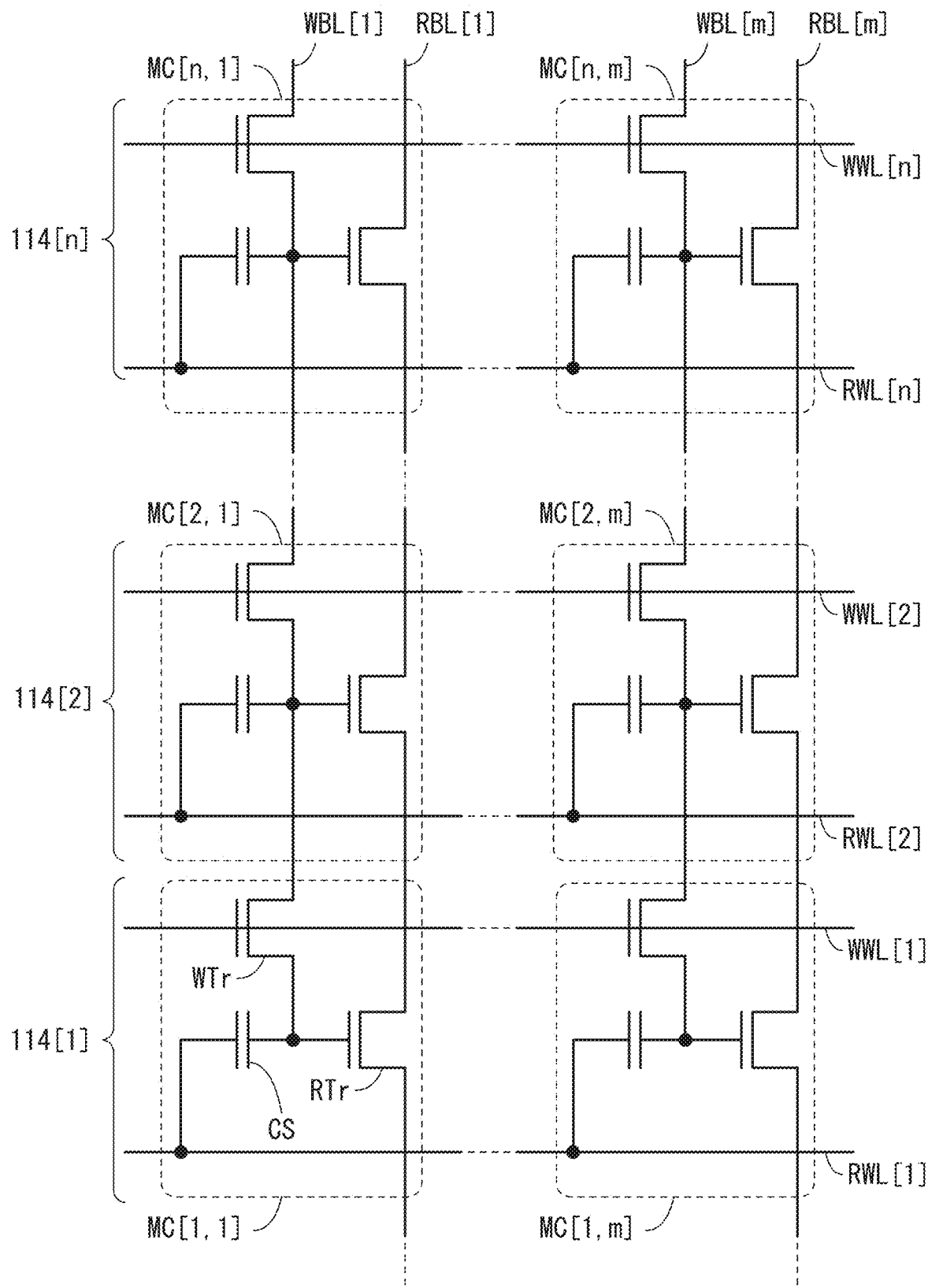
FIG. 1 is a circuit diagram illustrating a semiconductor device according to one embodiment of the present invention.

Embodiments according to the present invention will be described in detail with reference to the accompanying drawings. Note that the present invention is not limited to the description below, and it is easily understood by those skilled in the art that modes and details of the present invention can be modified in various ways. In addition, the present invention should not be construed as being limited to the description in the embodiments given below. In describing structures of the invention with reference to the drawings, the same reference numerals are used in common for the same portions in different drawings. Note that the same hatch pattern is applied to similar parts, and the similar parts are not especially denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

Embodiment 1

In this embodiment, a circuit configuration, a method for manufacturing, and an operation of a semiconductor device according to one embodiment of the disclosed invention will be described with reference to FIG. 1, FIG. 2, FIG. 3, FIGS. 4A and 4B, FIGS. 5A and 5B, FIGS. 6A and 6B, FIG. 7, FIG. 8, FIG. 9, FIG. 10, FIG. 11, FIG. 12, FIG. 13, FIG. 14, FIG. 15, FIG. 16, and FIG. 17. In the following description, for example, [x,y] refers to an element in the x-th row and in the y-th column, and [z] refers to an element in the z-th row or in the z-th column. These descriptions are omitted when there is no need to specify a column and a row.

First, the circuit configuration of a memory cell array of a semiconductor device is described with reference to FIG. 1. FIG. 1 illustrates a circuit diagram of a memory cell array including n rows and m columns. The memory cell array includes memory cells MC[1,1] to MC[n,m], write word lines WWL[1] to WWL[n], read word lines RWL[1] to RWL[n], write bit lines WBL[1] to WBL[m], and read bit lines RBL[1] to RBL[m] for controlling the memory cells. Patent Document 1 to Patent Document 3 can be referred to for the circuit configuration.

As will be described later, the memory cells MC[1,1] to MC[n,m] are three-dimensionally stacked over a substrate (e.g., a semiconductor wafer). Specifically, a memory cell layer 114[2] (the memory cells MC[2,1] to MC[2,m]) is stacked over a memory cell layer 114[1] (the memory cells MC[1,1] to MC[1,m]).

Each memory cell MC includes, for example, a write transistor WTr, a read transistor RTr, and a capacitor CS. The on/off of the write transistor WTr is controlled with the write word line WWL. The potential of one electrode of the storage capacitor is controlled with the read word line RWL. The other electrode of the storage capacitor is electrically connected to a gate of the read transistor RTr. The other electrode of the storage capacitor is also referred to as a memory node. A memory node of each memory cell is electrically connected to one of a source and a drain of the write transistor WTr.

In terms of circuit configuration, the source and the drain of the write transistor WTr are electrically connected in series to the source and the drain of the write transistor WTr of the adjacent memory cell. Likewise, the source and the drain of the read transistor RTr are electrically connected in series to the source and the drain of the read transistor RTr of the adjacent memory cell.

As will be described later, the write transistor WTr and the read transistor RTr of the memory cell MC each share a columnar semiconductor with other memory cells MC to achieve the above-described circuit configuration. Specifically, write transistors WTr in a column can be configured with stacked write word lines WWL[1] to WWL[n] and a first semiconductor having a columnar shape and filling a first hole that penetrates the stacked word lines WWL[1] to [n] On the side surface of the first hole, an insulating film is provided between the first semiconductor and the write word lines WWL[1] to WWL[n]; the insulating film has a function of preventing current flow between the first semiconductor and the write word lines WWL[1] to WWL[n].

Likewise, read transistors RTr in a column can be configured with n electrode layers (conductive layers), which are stacked and correspond to memory nodes of memory cells MC, and a second semiconductor having a columnar shape and filling a second hole that penetrates the n electrode layers. On the side surface of the second hole, an insulating film is provided between the second semiconductor and the read word lines RWL[1] to RWL[n]. Meanwhile, the first hole also penetrates the n electrode layers, securing electrical connection between the first semiconductor and each of the n electrode layers.

An example of operation methods is described with reference to FIGS. 2 and 3; for the details, see Patent Documents 1 to 3. Note that in the following description, a low level and a high level do not refer to any fixed potentials, and when wirings are different, specific potentials may also be different. For example, the high level and the low level of the write word line WWL may be different from the high level and the low level of the read word line RWL, respectively.

Figure 2:
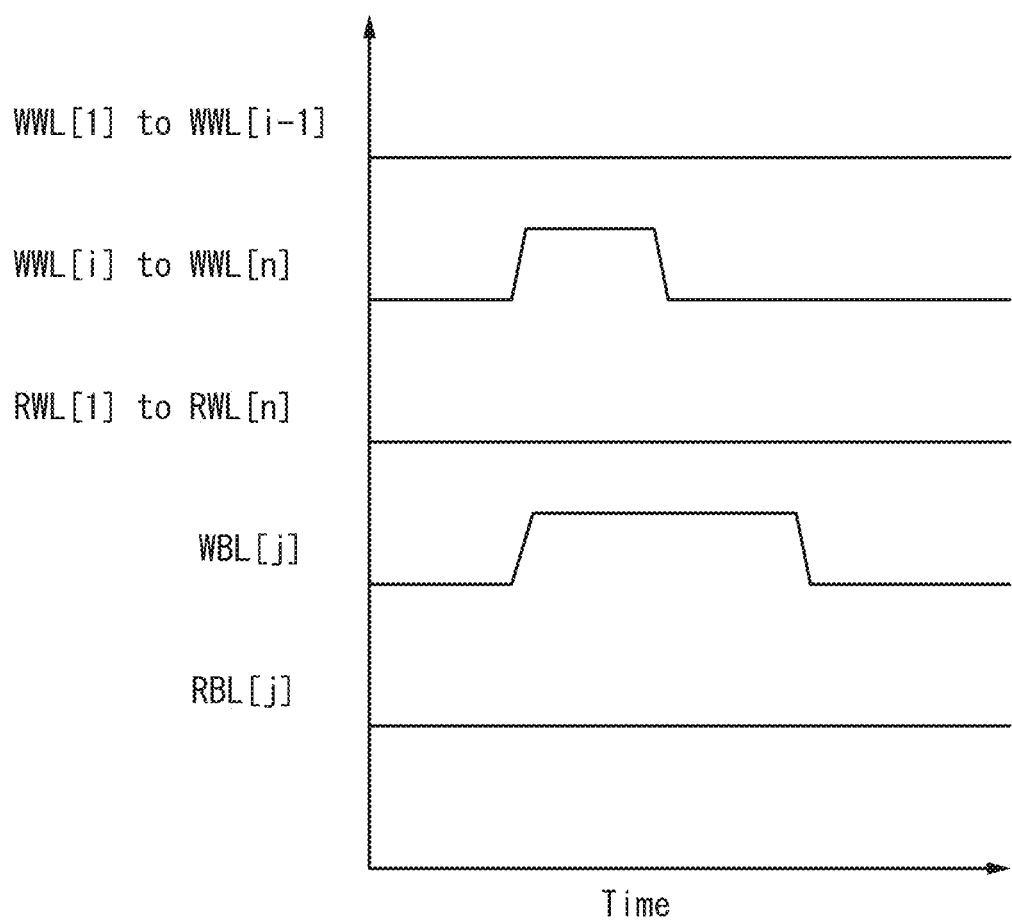
FIG. 2 illustrates a driving method for a semiconductor device according to one embodiment of the present invention.
Figure 3:
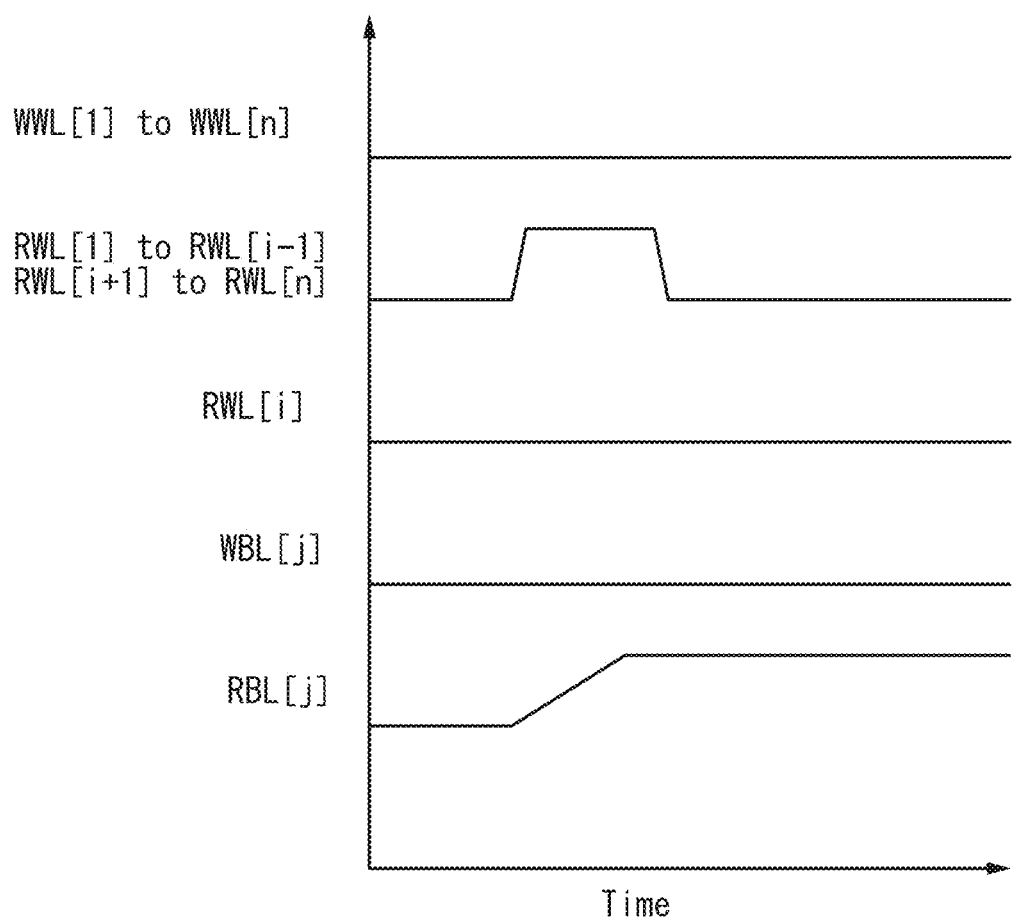
FIG. 3 illustrates a driving method for a semiconductor device according to one embodiment of the present invention.

First, described with reference to FIG. 2 is an example where data (binary or multilevel) is written into a memory in an i-th row and in a j-th column (i is greater than or equal to 1 and less than or equal to n; j is greater than or equal to 1 and less than or equal to m). Data to be written is supplied from the upper side in FIG. 1 (the side of the memory cell layer 114[$n$]). Thus, in the circuit illustrated in FIG. 1, writing is sequentially performed from the lower memory layer to the upper memory layer. For example, when data is to be written into the memory cell layer 114 [1] after data is written into the memory cell layer 114[2], the data written in the memory cell layer 114[2] will be lost in writing data in the memory cell layer 114 [1] unless the data written in the memory cell layer 114[2] is once read and stored.

To keep the data in the lower memory cell layer, the write transistors WTr are turned off of the layers below the layer to which data is written. Thus, as illustrated in FIG. 2, when data is written to the memory cell MC[i,j], the potentials of the write word lines WWL [1] to WWL [i−1] are made low so that data will not be supplied to the memory cell layers 114[1] to 114[$i$−1].

Meanwhile, when the write transistors WTr in the memory cell layers 114[i+1] to 114[n] are turned off, the data to be written will not reach the memory cell layer 114[i]. Thus, as illustrated in FIG. 2, the potentials of the write word lines WWL [i] to WWL [n] are made high to turn on the write transistors WTr that are controlled by these write word lines so that the data will be supplied to the memory cell layer 114[i]. A potential corresponding to data to be written (binary or multi-level) is supplied to the write bit line WBL[j]. Ideally, the potential is supplied to the memory node of the memory cell MC[i,j].

Note that with the circuit illustrated in FIG. 1, the read bit line RBL can be controlled independently, and does not need to be a specific potential; the potential of the read bit line RBL may be, for example, made low. The potential of the read word line RWL may be also made low.

Subsequently, an example of reading data stored in the memory cell MC[i,j] is described with reference to FIG. 3. In this case, to maintain data stored in each memory cell MC, the write transistor WTr needs to be in an absolute off-state. Therefore, the potentials of the write word lines WWL [1] to WWL [n] are made low.

In the circuit illustrated in FIG. 1, reading data from a certain memory cell MC is performed as follows: read transistors RTr of all other memory cells than the certain memory cell MC in the column that includes the certain memory cell MC are turned on, and the state of the read transistor RTr of the memory cell MC to read is set to correspond to the retained data.

The potentials of the read word lines RWL[1] to RWL [i−1] and the read word lines RWL [i+1] to RWL [n] are made high so that the read transistors of the memory cells MC[1,j] to MC[i−1,j] and the memory cells MC[i+1,j] to MC[n,j] will be turned on, regardless of the data stored in each memory cell MC.

Meanwhile, the potential of the read word line RWL[i] is made low. Consequently, the potential of the read bit line RBL[j] is changed from the initial potential and becomes corresponding to the potential of the memory node of the memory cell MC[i,j] (i.e., the gate potential of the read transistor RTr of the memory cell MC[i,j]).

For example, 0V and +3V are supplied to one end (first node) and the other end (second node) of the read bit line RBL[j], respectively. Then the first node is put in a floating state, and subsequent potential is observed. As illustrated in FIG. 3, when the potentials of the read word lines RWL[1] to RWL[i−1] and the read word lines RWL[i+1] to RWL[n] are made high, the potential of the first node is increased by the charge supplied from the second node whereas it is difficult to increase the potential of the first node to more than the apparent threshold voltage of the read transistor RTr of the memory cell MC[i,j].

In this manner, the data stored in the memory cell MC[i,j] can be read. It is of course possible to use an analog value as the apparent threshold voltage of the read transistor RTr of the memory cell MC[i,j], and accordingly the potential of the first node can be read as an analog value. That is, multi-level data can be read.

For easy understanding of the structure of the semiconductor device according to this embodiment, a manufacturing method thereof is described below with reference to FIGS. 4A and 4B, FIGS. 5A and 5B, FIGS. 6A and 6B, FIG. 7, FIG. 8, FIG. 9, FIG. 10, FIG. 11, FIG. 12, and FIG. 13. Note that FIGS. 4A, 5A, and 6A are schematic top views of a work-in-progress semiconductor device, and FIGS. 4B, 5B, and 6B are schematic cross-sectional views taken along straight lines A-B in FIGS. 4A, 5A, and 6A, respectively.

Figure 4A:
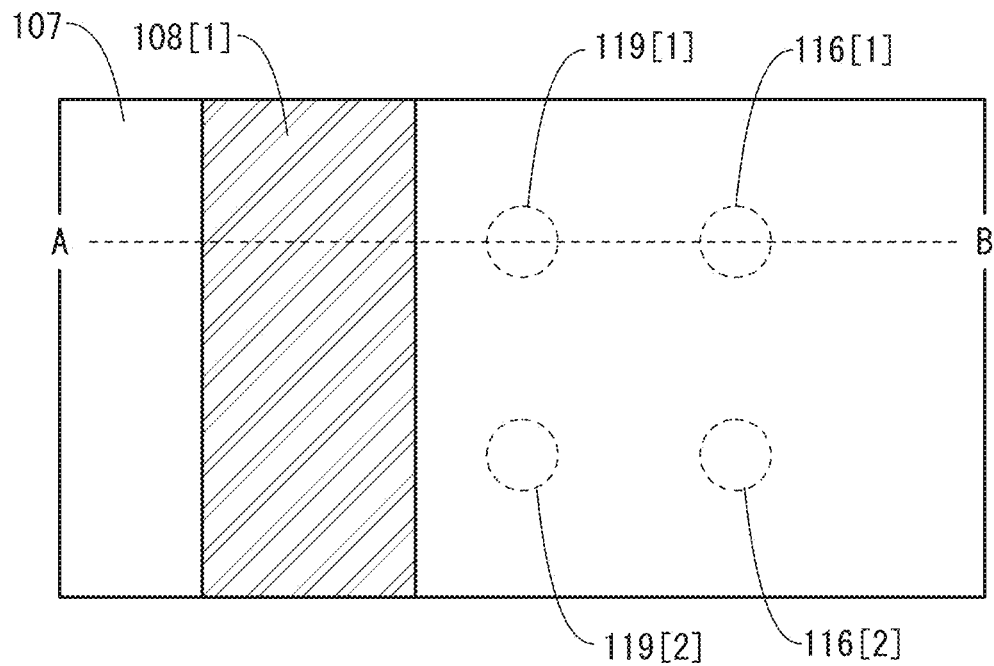
FIGS. 4A and 4B illustrate a manufacturing process of a semiconductor device according to one embodiment of the present invention.
Figure 5A:
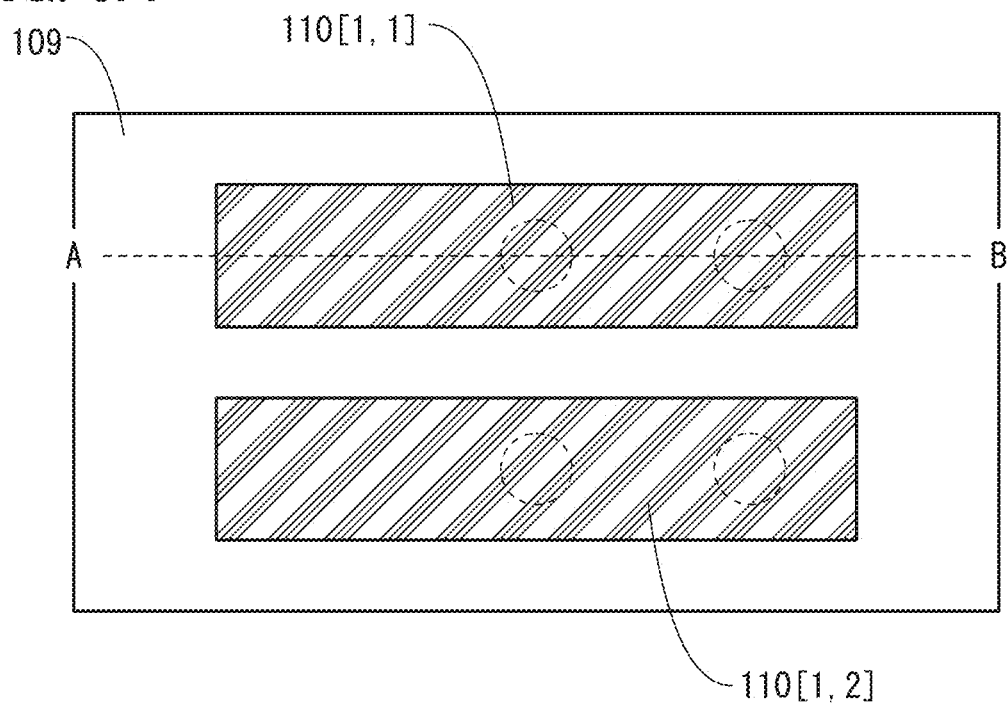
FIGS. 5A and 5B illustrate a manufacturing process of a semiconductor device according to one embodiment of the present invention.
Figure 5B:
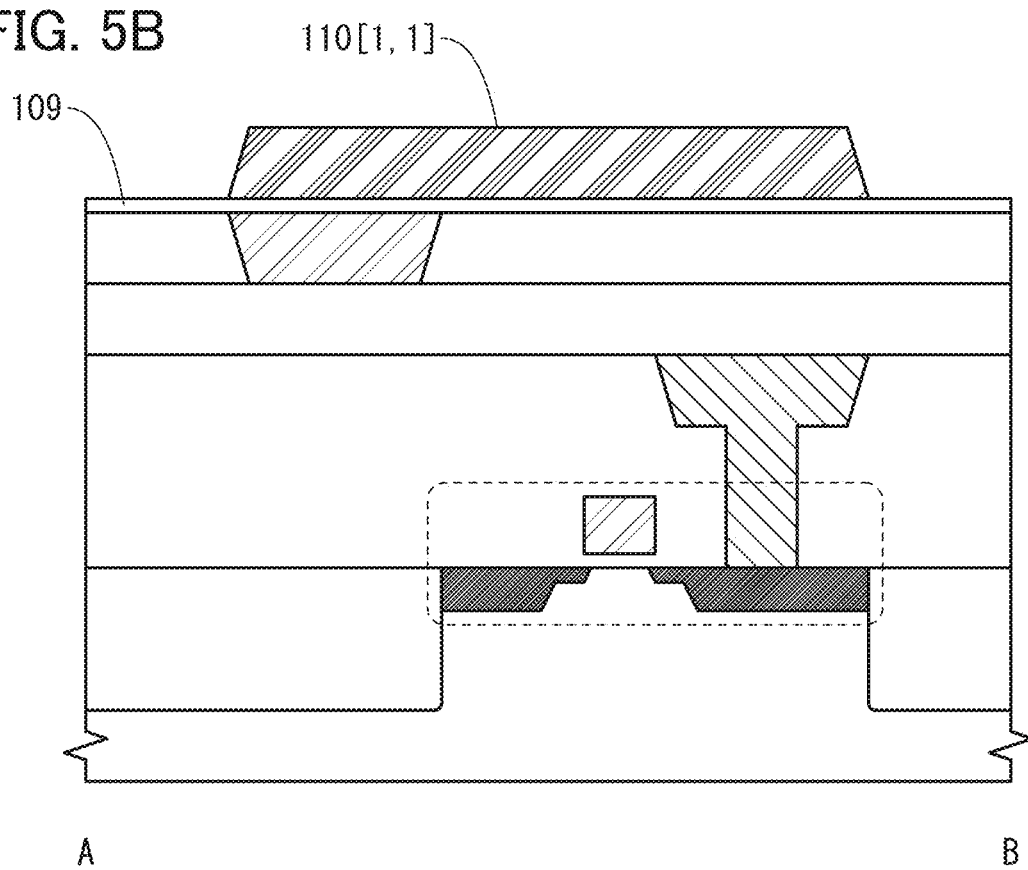
Figure 6A:
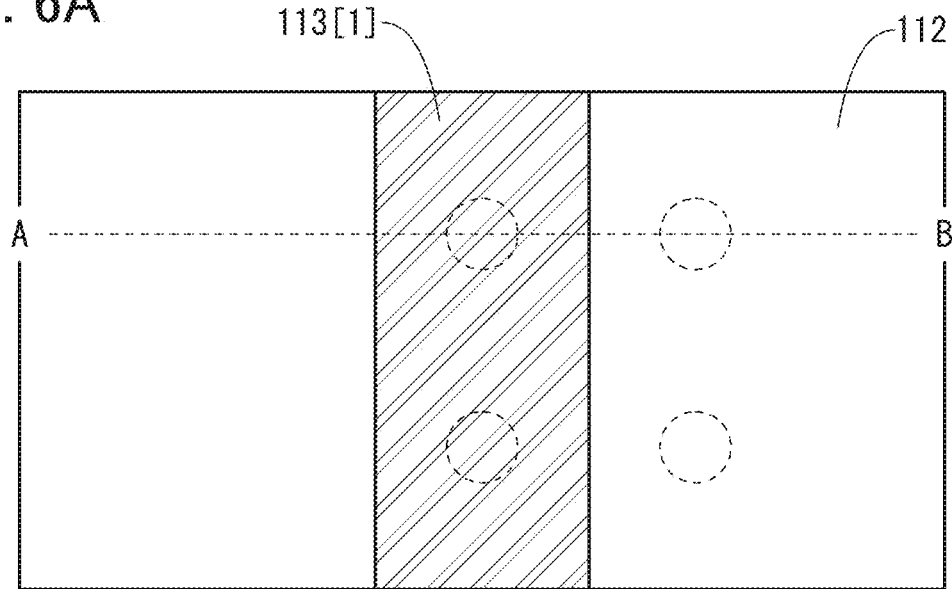
FIGS. 6A and 6B illustrate a manufacturing process of a semiconductor device according to one embodiment of the present invention.
Figure 6B:
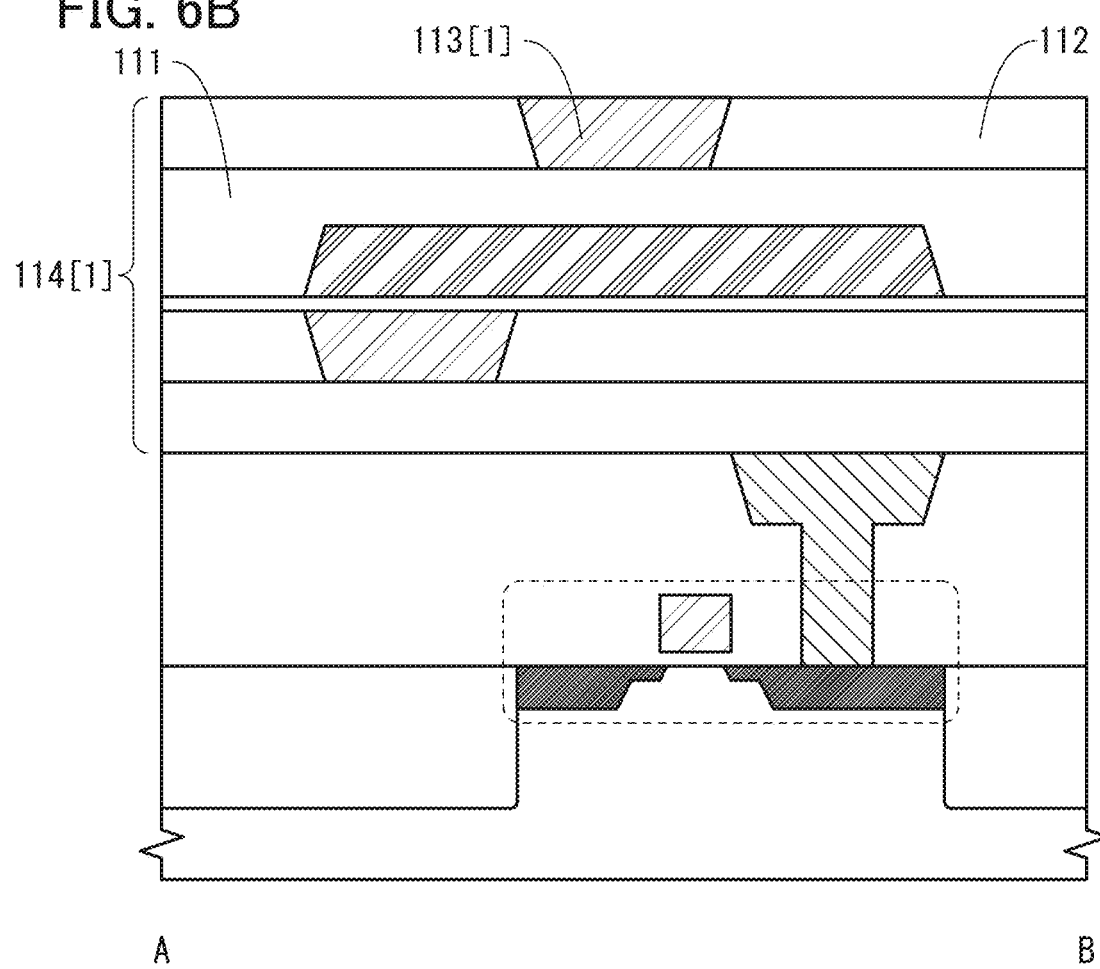

Note that the positions of points A and B in FIGS. 4A, 5A, and 6A are the same. FIGS. 7 to 13 are cross-sectional schematic views taken along the straight line A-B.

Figure 4B:
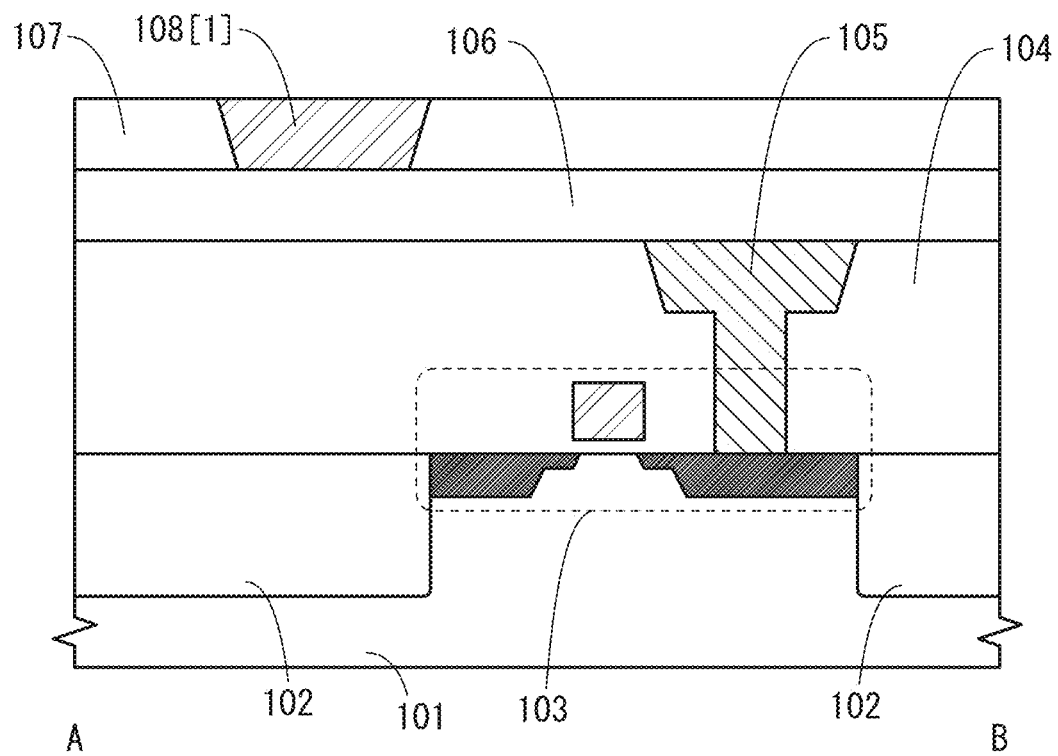

As illustrated in FIG. 4B, a substrate used for a semiconductor device is a semiconductor wafer 101 that is already provided with an integrated circuit including an element isolation insulator 102, a transistor 103, an interlayer insulator 104, a contact plug 105, and the like. An insulator 106 is formed to cover the interlayer insulator 104 and the contact plug 105. On top of that, for example, an insulator 107 that releases hydrogen by heating is formed. As the insulator 107, silicon nitride containing hydrogen is preferably used.

The insulator 106 and the insulator 107 can be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

Then a first wiring 108[1], which corresponds to the read word line RWL[1], is embedded into the insulator 107. The first wiring 108[1] is preferably formed of a material of which surface is insulated by chemical reaction such as oxidation. For example, silicon, aluminum, and the like can be used. The first wiring 108[1] can be obtained by forming a conductive film by a sputtering method, a CVD method, an MBE method, a PLD method, an ALD method, or the like, and then etching the conductive film by a CMP method.

As illustrated in FIG. 4A, the first wiring 108[1] extends in one direction. Note that in FIG. 4A, dotted circles indicate positions for forming the above-described first hole (the hole 119) and the second hole (the hole 116). As can be seen from FIG. 4A, the first wiring 108[1] is provided so as not to overlap with these holes. Note that the holes 116[1] and 119[1] indicate holes penetrating the memory cells in the first column, and the holes 116[2] and 119[2] indicate holes penetrating the memory cells in the second column. Note that the positions of the hole 116[1], the hole 116[2], the hole 119[1], and the hole 119[2] are indicated by dotted circles also in FIGS. 5A and 6A.

Then, as illustrated in FIG. 5B, a capacitor insulating film 109 is formed on the insulator 107 and the first wiring 108[1]. The capacitor insulating film 109 can be formed using a material with high insulating property, e.g., silicon oxide. Alternatively, a high dielectric constant material with a dielectric constant of 10 or more (e.g., hafnium oxide and zirconium oxide) may be used. The capacitor insulating film 109 can be formed by a sputtering method, a CVD method, an MBE method, a PLD method, an ALD method, or the like. The capacitor insulating film 109 may have a property of releasing hydrogen by heating.

Over the capacitor insulating film 109, a memory node electrode 110[1,1] functioning as a memory node and as a gate of a read transistor is provided. The memory node electrode 110[1,1] is formed by forming a conductive film by a sputtering method, a CVD method, an MBE method, a PLD method, an ALD method, or the like, and then by etching the film into a required shape.

As can be seen from FIG. 5B, the first wiring 108[1] faces the memory node electrode 110[1,1] with the capacitor insulating film 109 interposed therebetween. Thus, a capacitor CS can be formed by the first wiring 108[1], the capacitor insulating film 109, and the memory node electrode 110[1,1].

It is desirable that the memory node electrode 110[1,1] be formed of a material of which surface is chemically stable, a material that can maintain conductivity even when altered in quality by a chemical reaction, a material of which conductivity can be restored by another chemical reaction even when altered in quality by chemical reaction, a material that can be removed by a chemical reaction, or the like.

For example, in the case where the above-described chemical reaction is oxidation, the following materials may be used: (1) a metal or an alloy that is less likely to be oxidized, e.g., gold and platinum; (2) a metal or an alloy of which oxide is conductive, e.g., zinc; (3) a compound of which conductivity is not significantly reduced by oxidation, e.g., zinc oxide, indium oxide, or conductive metal oxide including zinc and/or indium (oxide including zinc and/or indium, and at least one of gallium, zinc, tin, or aluminum, e.g., indium tin composite oxide, indium zinc composite oxide, aluminum zinc composite oxide, and indium zinc gallium composite oxide); (4) a metal or an alloy that can be readily reduced even when oxidized, e.g., tin, nickel, and copper; or (5) a conductive material that vaporizes when oxidized and does not form an insulating compound on the surface, e.g., graphite and graphene.

The memory node electrode 110[1,1] may be formed of a material that releases hydrogen by heating.

As can be seen from FIG. 5A, the memory node electrode 110[1,1] is formed on a limited area. A memory node electrode 110[1,2] is provided adjacent to the memory node electrode 110[1,1]. The memory node electrode 110[1,1] is not physically in contact with the memory node electrode 110[1,2]. The memory node electrode 110[1,1] and the memory node electrode 110[1,2] function as a memory node of the memory cell MC[1,1] and a memory node of the adjacent memory cell MC[1,2], respectively. As can be seen from FIG. 5A, the holes 116[1] and 119[1] penetrate the memory node electrode 110[1,1], and the holes 116[2] and 119[2] penetrate the memory node electrode 110[1,2].

Then, as illustrated in FIG. 6B, for example, an insulator 111 with a physical property of releasing hydrogen by heating is formed over the capacitor insulating film 109 and the memory node electrode 110[1,1]. As the insulator 111, silicon nitride containing hydrogen is preferably used. The insulator 111 can be formed by a sputtering method, a CVD method, an MBE method, a PLD method, an ALD method, or the like.

Further, on top of that, for example, an insulator 112 with a physical property of releasing hydrogen by heating is formed. As the insulator 112, silicon nitride containing hydrogen is preferably used. The insulator 112 can be formed by a sputtering method, a CVD method, an MBE method, a PLD method, an ALD method, or the like.

Then a second wiring 113[1], which corresponds to the write word line WWL[1], is embedded into the insulator 112. The second wiring 113[1] may be formed using the same material and the same manufacturing process as those of the first wiring 108[1]. In this manner, the first memory cell layer 114[1] is formed.

As illustrated in FIG. 6A, the second wiring 113[1] extends in the same direction as the first wiring 108[1]. As can be seen from FIG. 4A, the holes 119[1] and 119[2] penetrate the second wiring 113[1]. Meanwhile, the holes 116[1] and 116[2] do not penetrate the second wiring 113[1].

Figure 7:
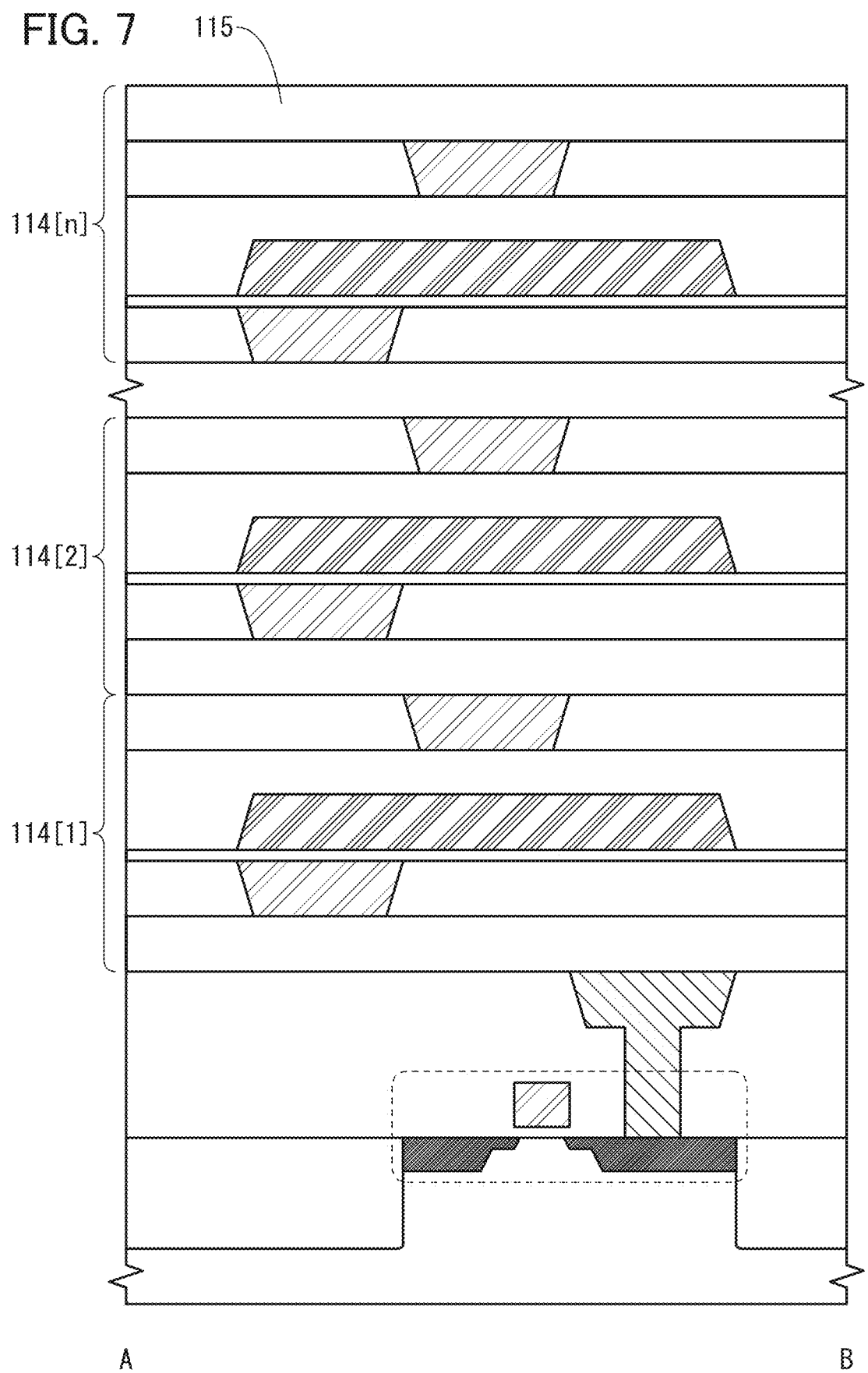
FIG. 7 illustrates a manufacturing process of a semiconductor device according to one embodiment of the present invention.

After that, the above-described process is repeated to stack the memory cell layer 114[2] to the n-th memory cell layer 114[n] over the memory cell layer 114[1], as illustrated in FIG. 7. Over the n-th memory cell layer 114[n], an insulator with a physical property of releasing hydrogen by heating is formed. As the insulator 115, silicon nitride containing hydrogen is preferably used.

Figure 8:
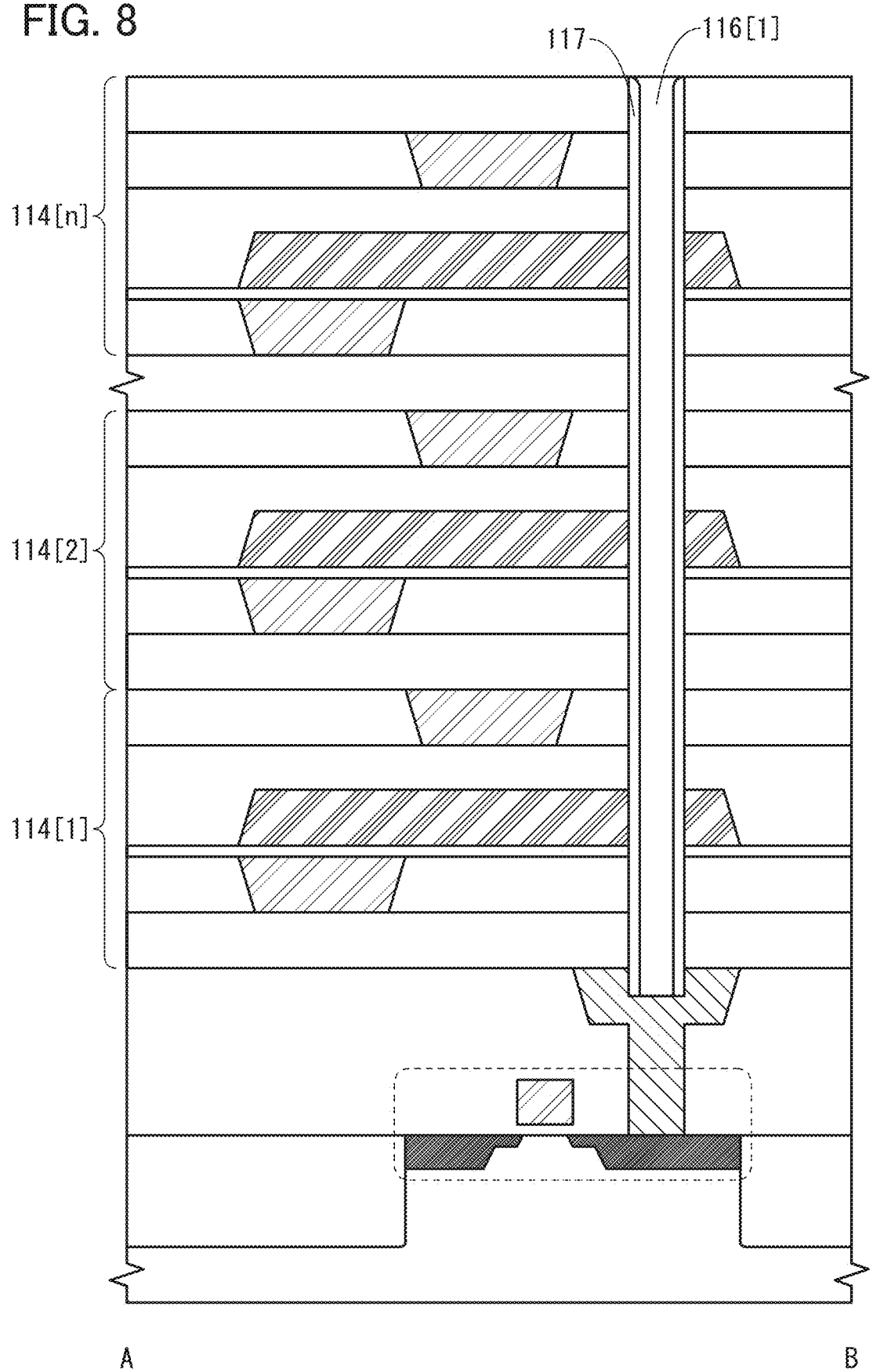
FIG. 8 illustrates a manufacturing process of a semiconductor device according to one embodiment of the present invention.

Subsequently, as illustrated in FIG. 8, the hole 116[1] that goes from the insulator 115 to the contact plug 105 is formed, and the side surface of the hole 116[1] is covered with an insulating film 117. The insulating film 117 is formed using any one of silicon oxide, hafnium oxide, and zirconium oxide, or a multi-layer thereof, preferably with a thickness of 10 nm to 30 nm. For example, an insulating film is formed by an ALD method or the like, and then the portion parallel to the substrate surface is etched by anisotropic etching so that the contact plug 105 is exposed, as illustrated in FIG. 8. Although the hole 116[1] (the hole 116[2]) has an circular cross section as illustrated in FIG. 4A, the cross section is not limited thereto.

Figure 9:
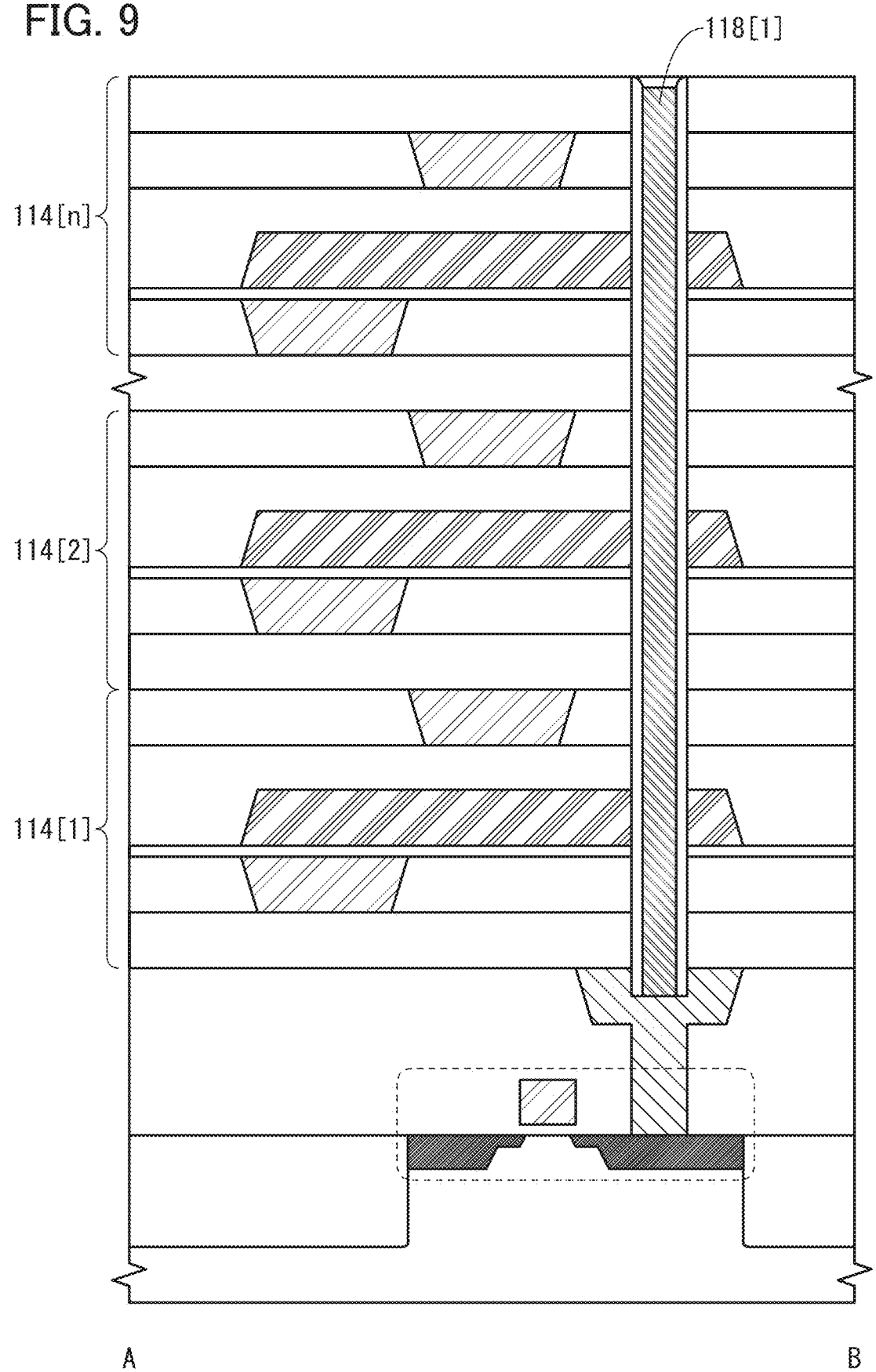
FIG. 9 illustrates a manufacturing process of a semiconductor device according to one embodiment of the present invention.

Subsequently, as illustrated in FIG. 9, the hole 116[1] is filled with the first semiconductor 118[1]. The first semiconductor 118 can be formed by a CVD method, an MBE method, an ALD method, or the like. The first semiconductor 118 may be polycrystalline. As the first semiconductor 118, a single material semiconductor such as silicon and germanium, or a compound semiconductor such as gallium arsenide, gallium nitride, and indium gallium zinc oxide can be used. In particular, silicon is preferably used because the first semiconductor 118 serves as the channel of the read transistor RTr and is required to have low on-state resistance, that is, high on-state current.

Figure 10:
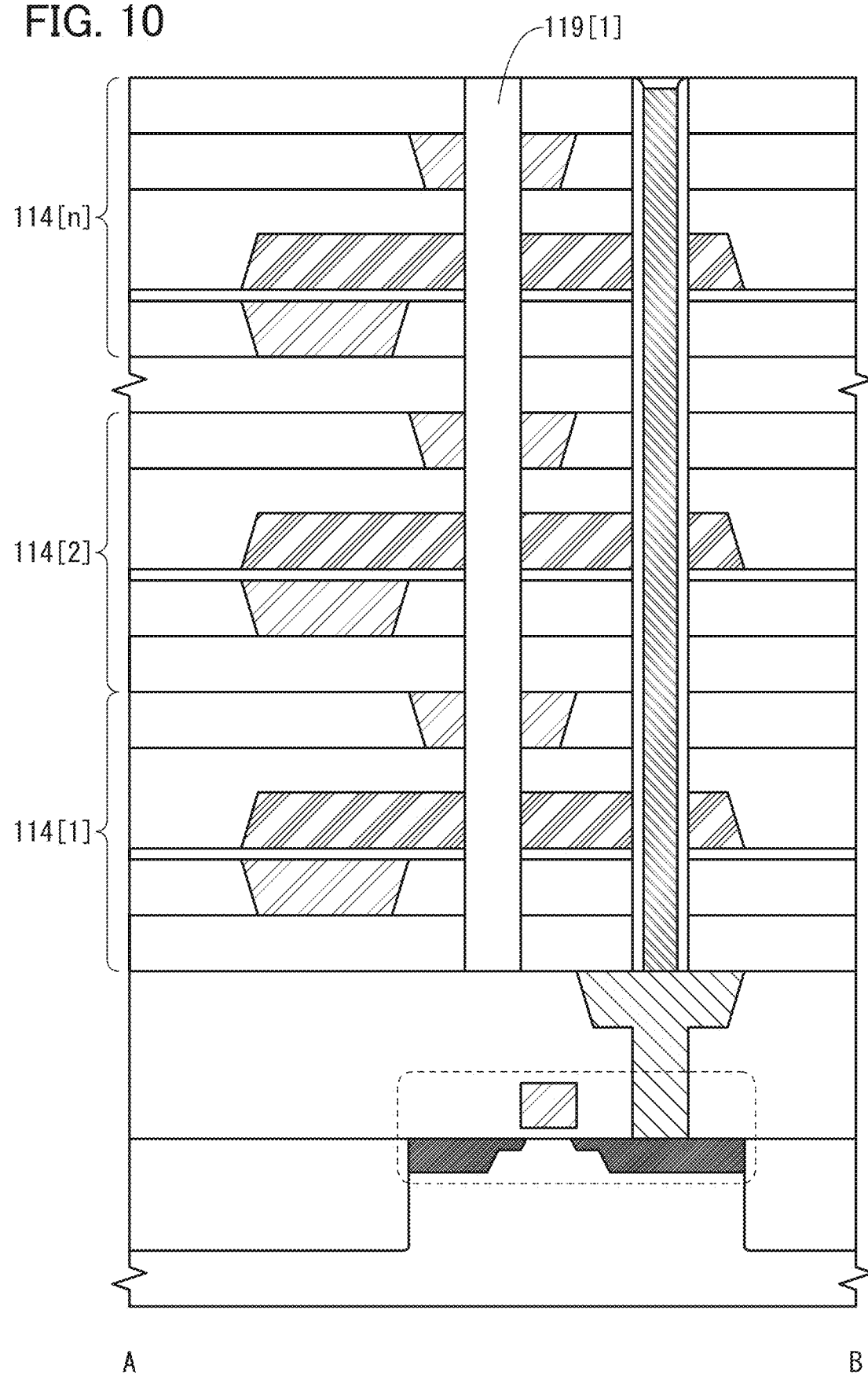
FIG. 10 illustrates a manufacturing process of a semiconductor device according to one embodiment of the present invention.

Then, as illustrated in FIG. 10, the hole 119[1] that goes from the insulator 115 to the interlayer insulator 104 is formed. Note that the hole 119[1] penetrates from the insulator 115 to the memory node electrode 110[1,1] in the memory cell layer 114[1] at least.

Figure 11:
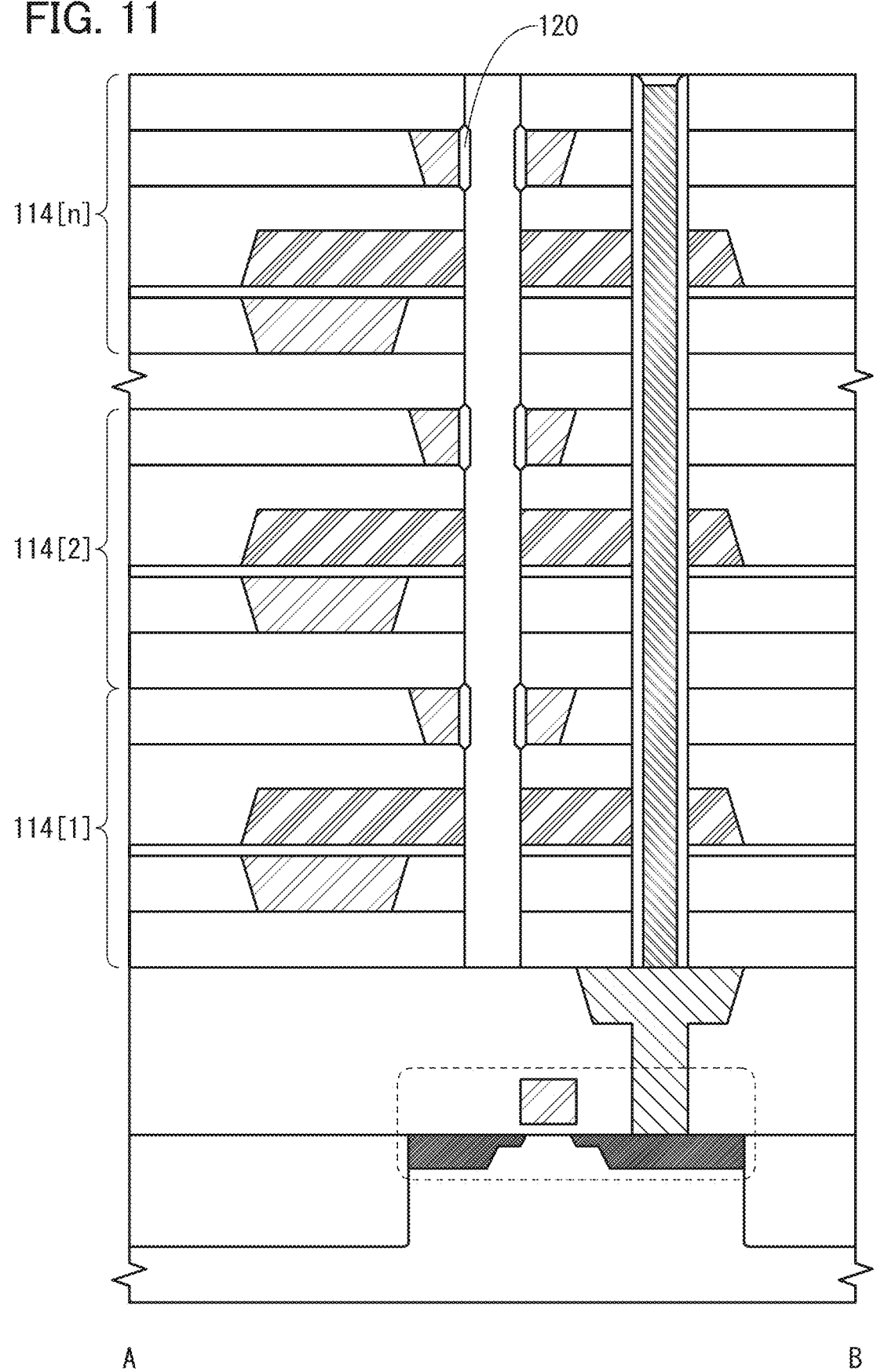
FIG. 11 illustrates a manufacturing process of a semiconductor device according to one embodiment of the present invention.

Then, as illustrated in FIG. 11, the surface of the second wiring 113 facing the hole 119[1] is oxidized to form an oxide film 120. For example, in the case where silicon is used as the second wiring 113, silicon oxide can be formed on the surface by thermal oxidation. Meanwhile, this process requires to a certain extent maintaining or to a certain extent restoring the conductivity of the surface of the memory node electrode 110 facing the hole 119[1]. It is preferable that the memory node electrode 110 be formed of a material described in the above (1) to (5).

Another method is to selectively cause oxidation using the electrical difference between the second wiring 113 and the memory node electrode 110, focusing on the fact that the second wirings 113 are present in the wide area whereas the memory node electrodes 110 are separately arranged and surrounded by insulators. For example, the surface of the second wiring 113 facing the hole 119[1] is selectively oxidized by supplying a given potential to the second wiring 113 in an electrolyte solution or in plasma. Specifically, an insulating oxide film can be formed on the surface of the second wiring 113 facing the hole 119[1] by anodizing. Meanwhile, the memory node electrode 110 is not supplied with such a potential, and an insulating oxide film is not formed.

Figure 12:
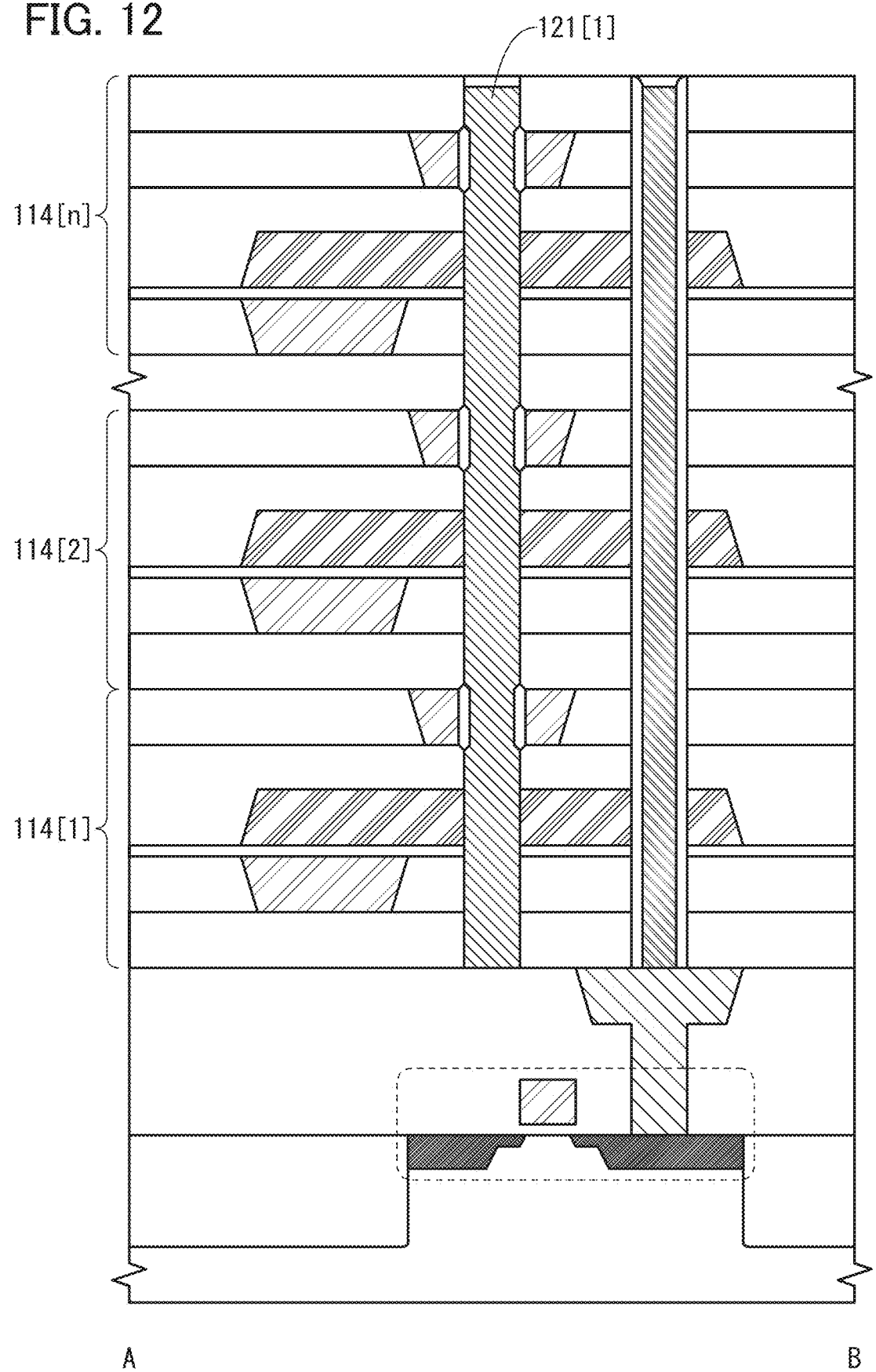
FIG. 12 illustrates a manufacturing process of a semiconductor device according to one embodiment of the present invention.

Subsequently, as shown in FIG. 12, the hole 119[1] is filled with a second semiconductor 121[1]. The second semiconductor 121 can be formed by a CVD method, an MBE method, an ALD method, or the like. As the second semiconductor 121, a single-material semiconductor such as silicon and germanium, or a compound semiconductor such as gallium arsenide, gallium nitride, and indium gallium zinc oxide. In particular, indium gallium zinc oxide is preferably used because the second semiconductor 121 serves as the channel of the write transistor WTr and is required to have high on-state resistance, that is, low off-state current. Indium gallium zinc oxide will be described later. Patent Document 1 to Patent Document 3 may be also referred to.

Figure 13:
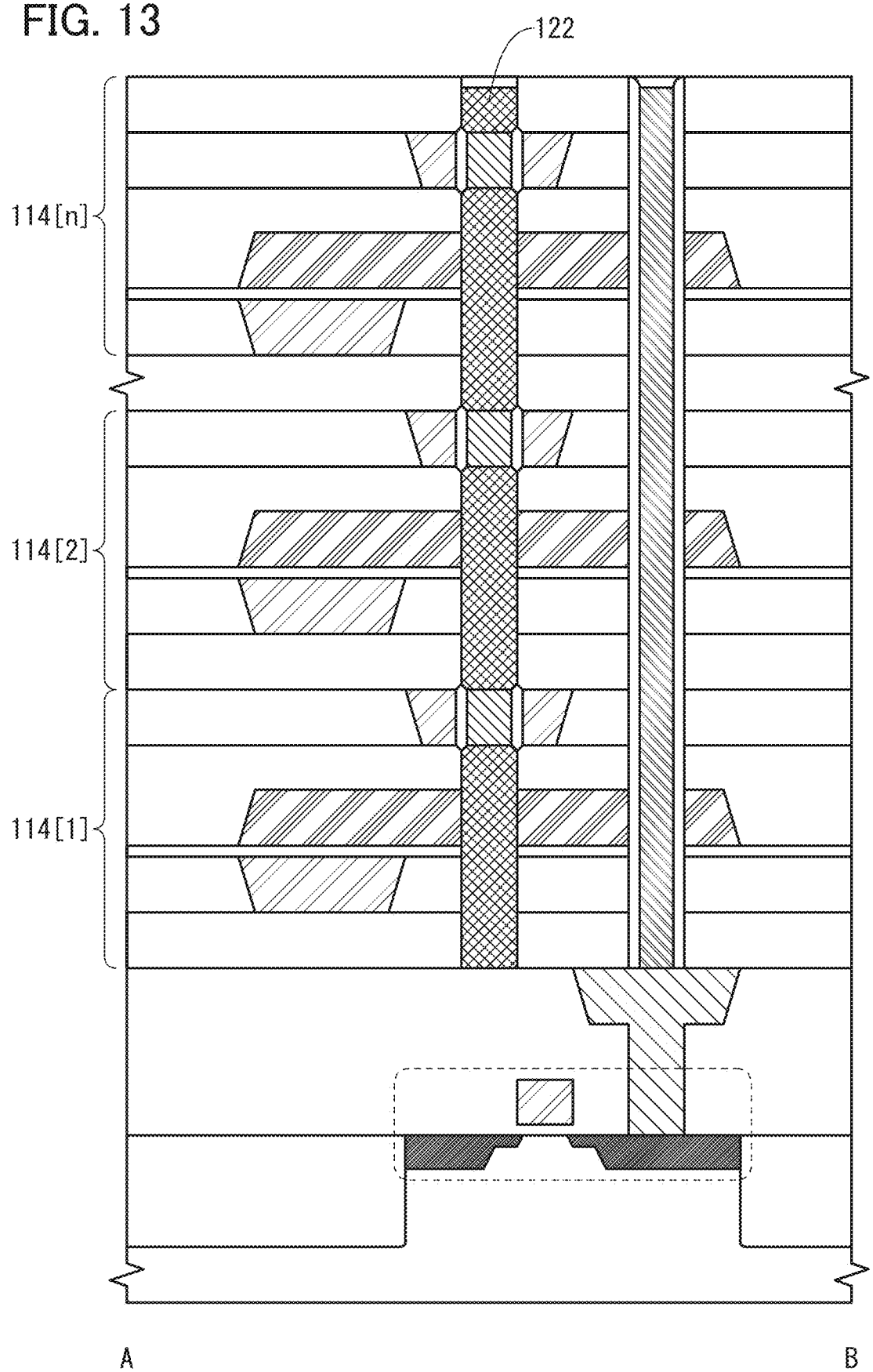
FIG. 13 illustrates a manufacturing process of a semiconductor device according to one embodiment of the present invention.

In the case where indium gallium zinc oxide is used as the second semiconductor 121 and a material with a physical property of releasing hydrogen by heating is used as the insulator 106, the insulator 107, the capacitor insulating film 109, the memory node electrode 110, and the insulator 111, subsequent annealing diffuses hydrogen from the insulator 106, the insulator 107, the capacitor insulating film 109, the memory node electrode 110, and the insulator 111 to the second semiconductor 121, and imparts conductivity to the second semiconductor 121. In other words, as illustrated in FIG. 13, a conductive region 122 is selectively formed. At this point, the region of the second semiconductor 121 where the conductive region 122 is not formed (where the second semiconductor 121 overlaps with the second wiring 113) serves as the channel of a transistor.

Figure 14:
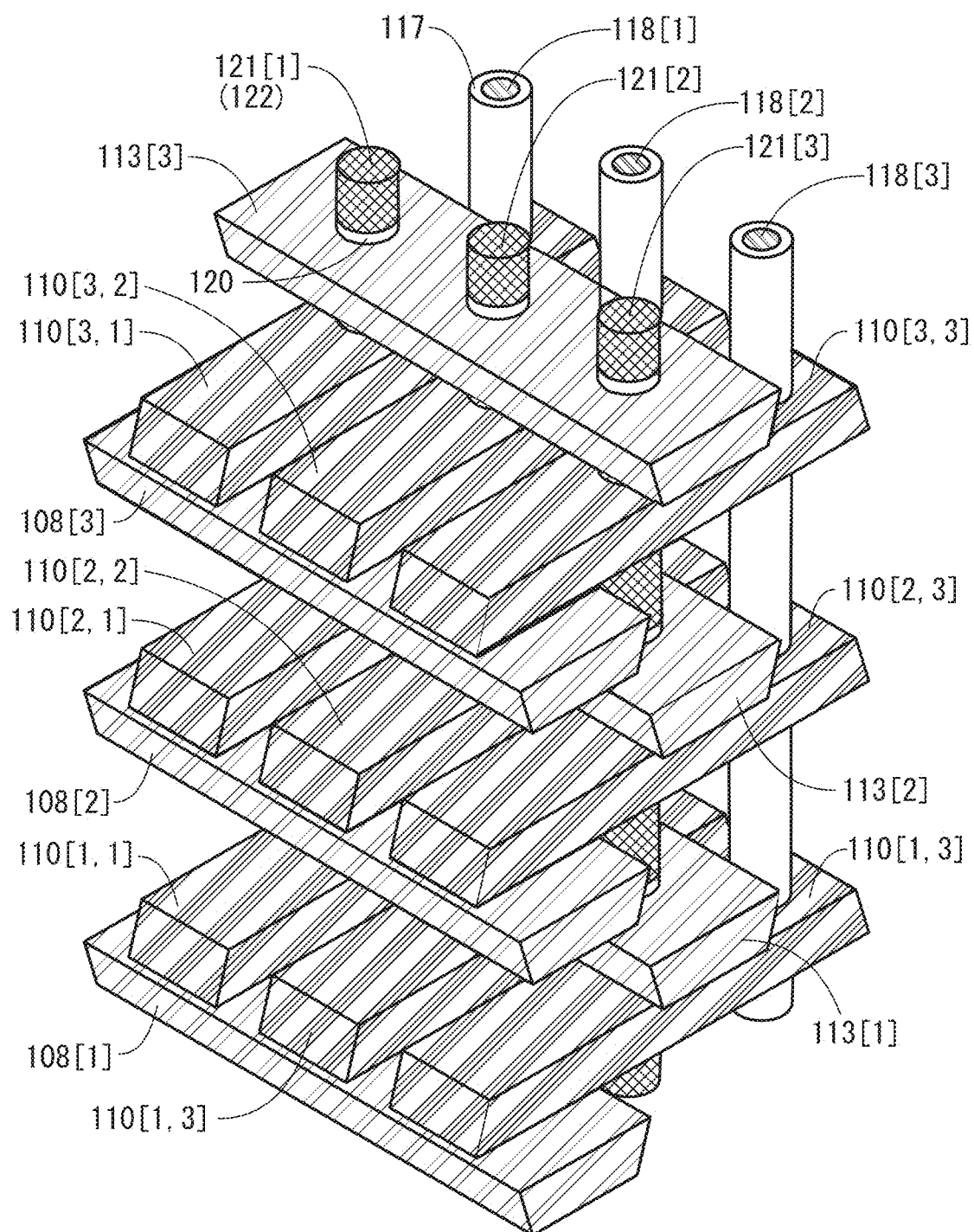
FIG. 14 is a perspective view illustrating a semiconductor device according to one embodiment of the present invention.

FIG. 14 three-dimensionally illustrates the positions of the first wirings 108[1] to 108[3], the second wirings 113[1] to 113[3], the first semiconductors 118[1] to 118[3], the second semiconductors 121[1] to 121[3], and nine memory node electrodes 110[1,1] to 110[3,3], which are penetrated by the first semiconductors 118[1] to 118[3], included in the first memory cell layer 114[1] to the third memory cell layer 114[3].

Note that the second semiconductors 121[1] to 121[3] each include the conductive region 122, as illustrated in FIG. 13. FIG. 14 also illustrates the oxide film 120, which is formed by oxidation of the second wiring 113.

Comparison of FIG. 1 and FIGS. 4A and 4B, FIGS. 5A and 5B, FIGS. 6A and 6B, FIG. 7, FIG. 8, FIG. 9, FIG. 10, FIG. 11, FIG. 12, FIG. 13, and FIG. 14 discloses the following. The memory cell MC[1,1] is provided over a substrate (the semiconductor wafer 101), and over these the memory cell MC[2,1] is provided. The memory cell MC[1,1] and the memory cell MC[2,1] each include the write transistor WTr (including the second wiring 113, the oxide film 120, and the second semiconductor 121), the read transistor RTr (including the memory node electrode 110, the insulating film 117, and the first semiconductor 118), and the capacitor CS (including the first wiring 108 extending substantially parallel to the second wiring 113, the capacitor insulating film 109, and the memory node electrode 110).

The gate (the memory node electrode 110[1,1]) of the read transistor RTr of the memory cell MC[1,1] is electrically connected to one of a source and a drain of the write transistor WTr (the portion of the conductive region 122 of the second semiconductor 121 between the second wiring 113[1] and the memory node electrode 110[1,1]) and to one electrode (the memory node electrode 110[1,1]) of the capacitor CS. The same applies to the gate of the read transistor RTr of the memory cell MC[2,1].

The axis in the channel length direction of the read transistor RTr of the memory cell MC[1,1] and the axis of the channel length direction of the read transistor RTr of the memory cell MC[2,1] (the center of the dotted circle indicating the position for forming the hole 116[1] illustrated in FIG. 4A) are both in the first semiconductor 118[1] or in the hole 116[1], and correspond to each other. Likewise, the axis in the channel length direction of the write transistor WTr of the memory cell MC[1,1] and the axis in the channel length direction of the write transistor WTr of the memory cell MC[2,1] (the center of the dotted circle indicating the position for forming the hole 119[1] illustrated in FIG. 4A) are both in the second semiconductor 121 and correspond to each other. In addition, all of the channel length directions of these four transistors are substantially perpendicular to the top surface of the substrate (the semiconductor wafer 101).

Further, the memory cell MC[1,1], for example, includes a wiring (the second wiring 113[1]) that functions as the gate of the write transistor WTr, an electrode (the memory node electrode 110[1,1]) that functions as the gate of the read transistor RTr, and a semiconductor (the second semiconductor 121) that fills a hole (the hole 119[1]) formed to penetrate the wiring and the electrode.

An insulating film (the oxide film 120) is interposed between the wiring (the second wiring 113[1]) that functions as the gate of the write transistor WTr and the semiconductor (the second semiconductor 121) that fills the hole (the hole 119[1]), whereas the semiconductor (the second semiconductor 121) that fills the hole (the hole 119[1]) is electrically connected to the electrode (the memory node electrode 110[1,1]) that functions as the gate of the read transistor RTr. Note that an insulator (the insulator 111) with a physical property of releasing hydrogen by heating is interposed between the wiring (the second wiring 113 [1]) that functions as the gate of the write transistor WTr and the electrode (the memory node electrode 110[1,1]) that functions as the gate of the read transistor RTr.

The condition where the insulating film (the oxide film 120) is formed between the wiring (the second wiring 113[1]) that functions as the gate of the write transistor WTr and the semiconductor (the second semiconductor 121) that fills the hole (the hole 119[1]) maintains the conductivity of the surface of the electrode (the memory node electrode 110[1,1]) that functions as the gate of the read transistor RTr. Alternatively, when different potentials are supplied to the wiring (the second wiring 113[1]) that functions as the gate of the write transistor WTr and to the electrode (the memory node electrode 110[1,1]) that functions as the gate of the read transistor RTr, the surface of the wiring (the second wiring 113[1]) that functions as the gate of the write transistor WTr is oxidized.

Modification Example 1

In the semiconductor device illustrated in FIG. 13, the conductivity of the first semiconductor 118 may pose a problem. Specifically, the conductivity of the portion of the first semiconductor 118 that overlaps with the memory node electrode 110 can be secured by controlling the potential of the memory node electrode 110, whereas the conductivity of the other portion of the first semiconductor 118 is determined by the conductivity of the first semiconductor 118 itself, the interface state between the first semiconductor 118 and the insulating film 117 in contact therewith, or the like. If the first semiconductor 118 is made excessively conductive, the off-state characteristics of the read transistor RTr will degrade, whereas if the first semiconductor 118 is made excessively insulating, the reading speed will decrease.

Figure 15:
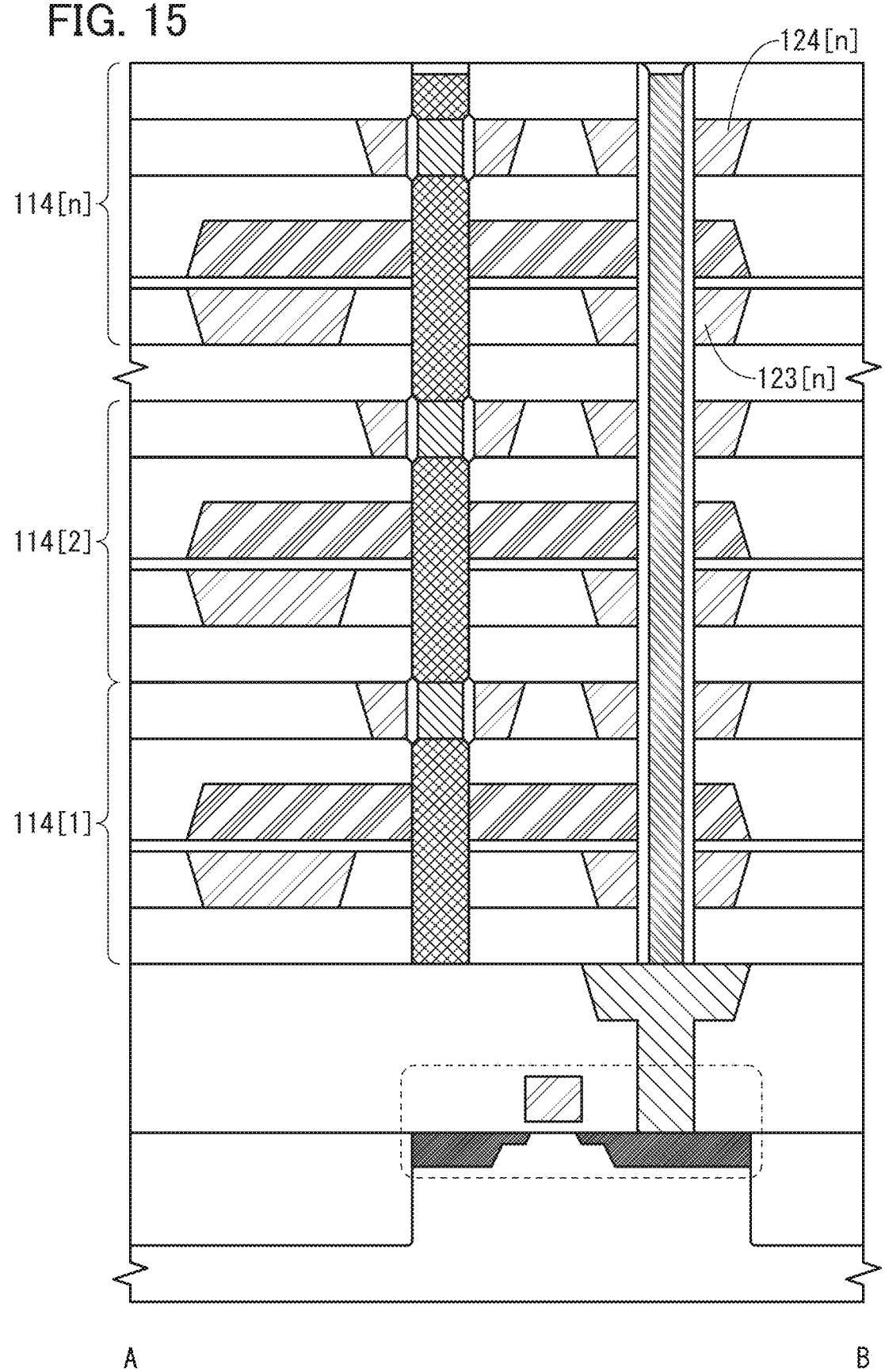
FIG. 15 is a cross-sectional view illustrating a semiconductor device according to one embodiment of the present invention.

This problem can be solved by, for example, forming a third wiring 123 and a fourth wiring 124 parallel to the first wiring 108 and to the second wiring 113, respectively, in the portions penetrated by the hole 116, as illustrated in FIG. 15. As a result, a large part of the first semiconductor 118 is covered with the memory node electrode 110, the third wiring 123, and the fourth wiring 124, and thus even when the conductivity of the first semiconductor 118 itself is low, high conductivity can be obtained by controlling the potential supplied to these wirings and the electrode.

Figure 16:
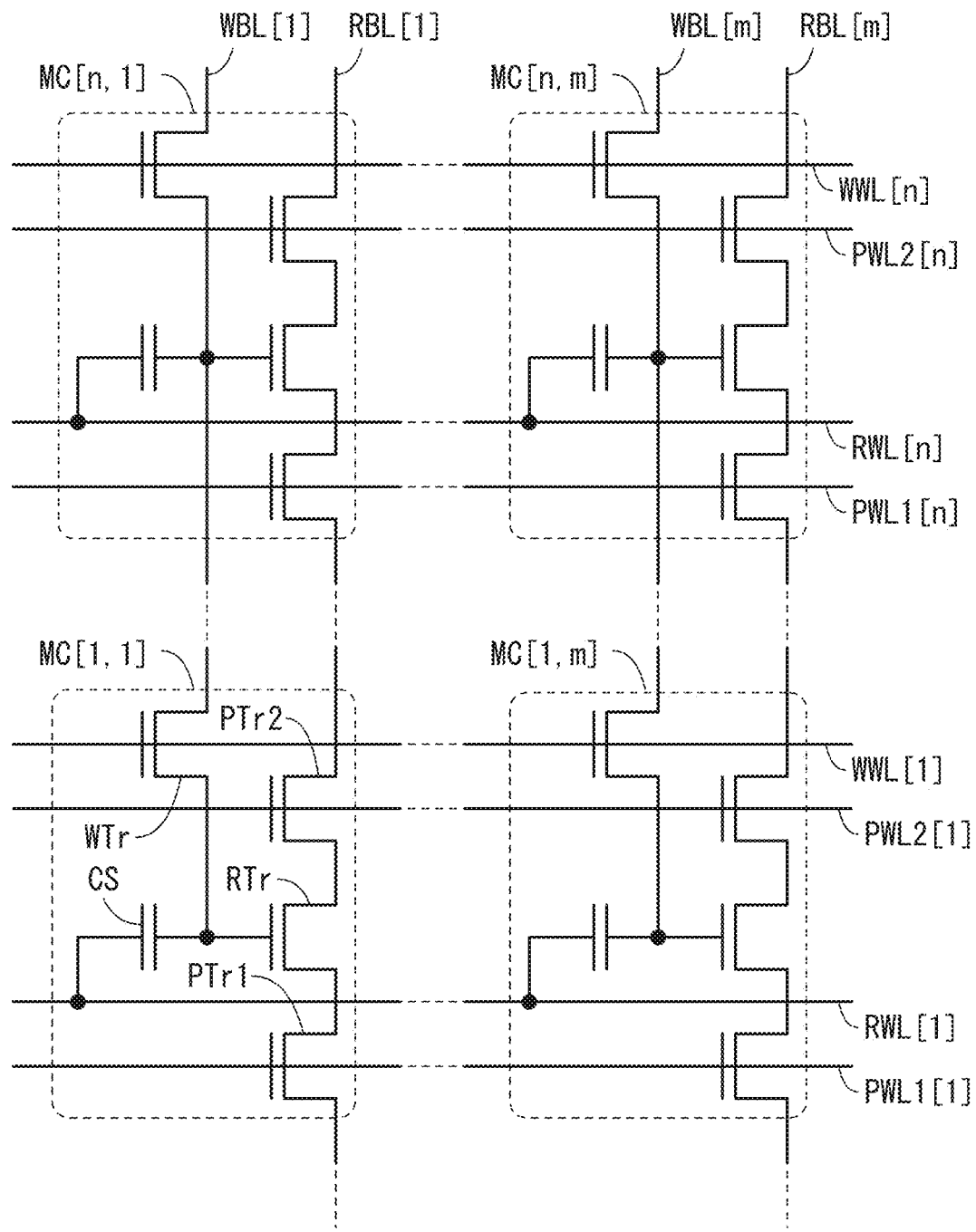
FIG. 16 is a circuit diagram illustrating a method for manufacturing a semiconductor device according to one embodiment of the present invention.

FIG. 16 illustrates a circuit configuration of the semiconductor device illustrated in FIG. 15. Comparison of FIGS. 1 and 16 clearly illustrates that there are a plurality of transistors (a parasitic transistor PTr1 and a parasitic transistor PTr 2) in series to a read transistor RTr. The on/off of the parasitic transistor PTr 1 is controlled with a parasitic word line PWL1 (corresponding to the third wiring 123), and the on/off of the parasitic transistor PTr 2 is controlled with the parasitic word line PWL2 (corresponding to the fourth wiring 124). Thus, a local conductivity of the first semiconductor 118 can be increased by turning on the parasitic transistor PTr 1 and the parasitic transistor PTr 2.

Modification Example 2

Figure 17:
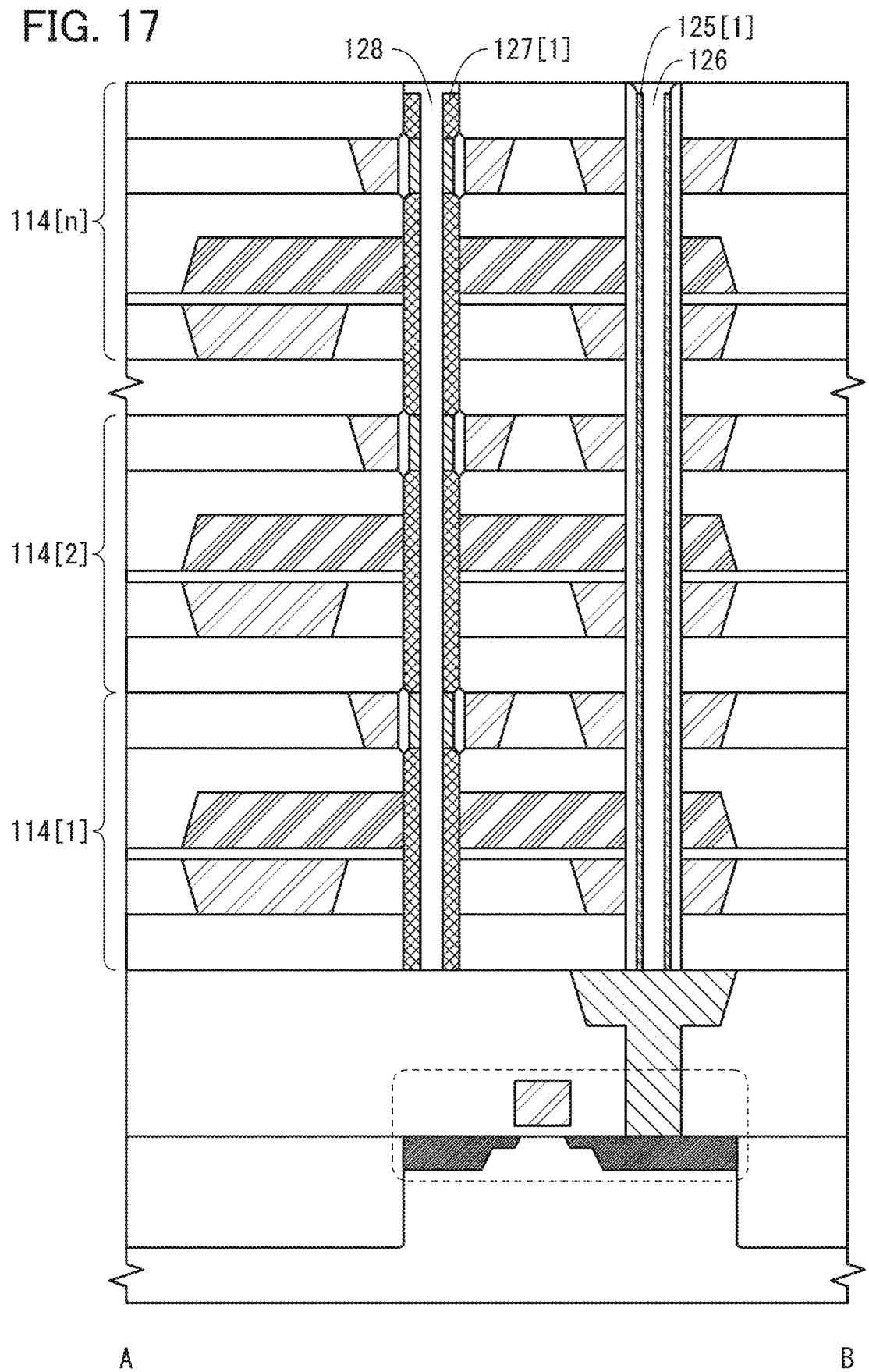
FIG. 17 illustrates a method for manufacturing a semiconductor device according to one embodiment of the present invention.

In the semiconductor device illustrated in FIGS. 13 and 15, the first semiconductor 118 and the second semiconductor 121 are embedded in the hole 116 and the hole 119, respectively, and thus are columnar (e.g., cylinders), whereas they may be tubular (e.g., hollow cylinders), as illustrated in FIG. 17. In the semiconductor device illustrated in FIG. 17, a hollow cylindrical first semiconductor 125[1] and a hollow cylindrical second semiconductor 127[1] are formed in the hole 116 and the hole 119, respectively. The hollow regions of the first semiconductor 125[1] and the second semiconductor 127[1] are filled with an insulator 126 and an insulator 128, respectively.

<Thickness of Second Wiring 113>

The thickness of the second wiring 113 determines the channel length of the write transistor WTr. In general, when the channel of the write transistor WTr is short, the on/off ratio is decreased by short channel effects; when the channel of the write transistor WTr is long, the on-state current is decreased. The former leads to leakage of charges stored in the memory node electrode 110, and thus limits data retention time. Meanwhile, the latter increases time required for data writing.

Aside from these, as illustrated in FIGS. 13 and 15, the thickness of the second wiring 113 is also related to the height of the first semiconductor 118. Specifically, the height of the first semiconductor 118 increases when the second wiring 113 is thick, and consequently the read bit line RBL is long, thus increasing parasitic capacitance. This increases time required for data reading.

<Feature of Memory Cell MC>

The memory cell MC does not suffer from the degradation of a tunnel insulating film, the issue of which has been pointed out with regard to conventional floating gate memory cells. This means that there is no limitation on the number of times of writing in principle. Furthermore, a high voltage needed for writing or erasing in a conventional floating gate memory cell is not necessary.

Such a configuration of the memory cell MC as in FIG. 12 or FIG. 13 increases storage capacity per unit area depending on the number of stack cells, and the above-described multiple data writing/reading provides a high-capacity semiconductor device.

<First Semiconductor 118>

For the first semiconductor 118, crystalline silicon such as polycrystalline silicon or single crystal silicon can be used. Note that one embodiment of the present invention is not limited to these examples; microcrystalline silicon, amorphous silicon, germanium, silicon carbide, silicon germanium, gallium arsenide, indium phosphide, zinc oxide, gallium oxide may alternatively be used, for example. Alternatively, a semiconductor that can be used as the second semiconductor 121 and is to be described later may be used.

Furthermore, in the case where polycrystalline silicon or the like is used as the first semiconductor 118, hydrogen may be supplied to first semiconductor 118 to terminate a dangling bond in the first semiconductor 118. Specifically, hydrogen can be supplied to the first semiconductor 118 through the insulating film 117 by using an insulator with a physical property of releasing hydrogen for the insulator 106, the insulator 107, the capacitor insulating film 109, the insulator 111, and the like. Alternatively, a similar effect can be achieved by using an insulator with a physical property of releasing hydrogen for the insulator 126.

Note that the first semiconductor 118 may include an impurity imparting p-type conductivity and an impurity imparting n-type conductivity. In the case where the first semiconductor 118 is silicon (Si), examples of the impurity imparting p-type conductivity include boron (B) and aluminum (Al). Examples of the impurity imparting n-type conductivity include phosphorus and arsenic.

<Insulating Film 117 and Insulator 126>

The structure of the insulating film 117 is described in detail below. The insulating film 117 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating film 117 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. Note that silicon nitride oxide means a substance that contains more nitrogen than oxygen and silicon oxynitride means a substance that contains more oxygen than nitrogen, in this specification and the like.

Any of the above-described materials that can be used as the insulating film 117 can be basically used as the insulator 126. Note that in the case where the dangling bond of the first semiconductor 125 is terminated with hydrogen, hydrogen that is made to be contained in the insulator 126 can be supplied to first semiconductor 125.

<Second Semiconductor 121>

It is preferable to use a metal oxide such as indium gallium zinc composite oxide as the second semiconductor 121. One of the characteristics of the transistor using a metal oxide is extremely low off-state current (see Patent Document 1 to Patent Document 3). Thus, the potential of the memory node electrode 110 can be retained for a very long time by turning off the write transistor WTr.

For example, in the case where the off-state current of the write transistor WTr is 10 zA (=1×10$^{-20}$ A) or less and the capacitance of the capacitor CS is approximately 1 fF, the variation in the potential of the memory node can be reduced to 1% or less for at least 10$^3$ seconds. Thus, 64-level data, for example, can be retained for 10$^3$ seconds. Note that, needless to say, the retention characteristics also depend on the channel length of the write transistor WTr and the capacitance of the capacitor CS.

The second semiconductor 121 is, for example, a metal oxide containing indium. When a metal oxide contains indium, for example, the carrier mobility (electron mobility) of the metal oxide increases. The second semiconductor 121 preferably contains an element M The element M is preferably Ti, Ga, Y, Zr, La, Ce, Nd, Sn, or Hf. Note that two or more of the above elements may be used in combination as the element M The element M is an element having high bonding energy with oxygen, for example. The element M is an element whose bonding energy with oxygen is higher than that of indium, for example. The element M is an element that can increase the energy gap of the metal oxide, for example. Furthermore, the second semiconductor 121 preferably contains zinc. When containing zinc, the metal oxide is easily crystallized in some cases. Such oxide is referred to as In-M-Zn oxide.

However, the second semiconductor 121 is not limited to a metal oxide containing indium. The second semiconductor 121 may be a metal oxide that does not contain indium and contains at least one of zinc, gallium, and tin (e.g., a zinc tin oxide or a gallium tin oxide) or the like.

The second semiconductor 121 may have different compositions in the outer side (in the oxide film 120 side) and in the inner side. For example, the second semiconductor 121 may have a three-layer structure, in which layers in the outer side and the inner side have a high ratio of the element M and are more insulating, with a layer with a lower ratio of the element M interposed therebetween. Here, the second semiconductor 121 is a three-layer structure composed of a first layer 121a, a second layer 121b, and a third layer 121c, in the order from the outer side. The same can be applied to the second semiconductor 127 illustrated in FIG. 17.

Preferred ranges of the atomic ratio of indium, the element M, and zinc contained in the In-M-Zn oxide are described below with reference to FIGS. 18A to 18C. Note that the proportion of oxygen atoms is not illustrated in FIGS. 18A to 18C. The terms of the atomic ratio of indium, the element M, and zinc contained in the In-M-Zn oxide are denoted by [In], [M], and [Zn].

Figure 18A:
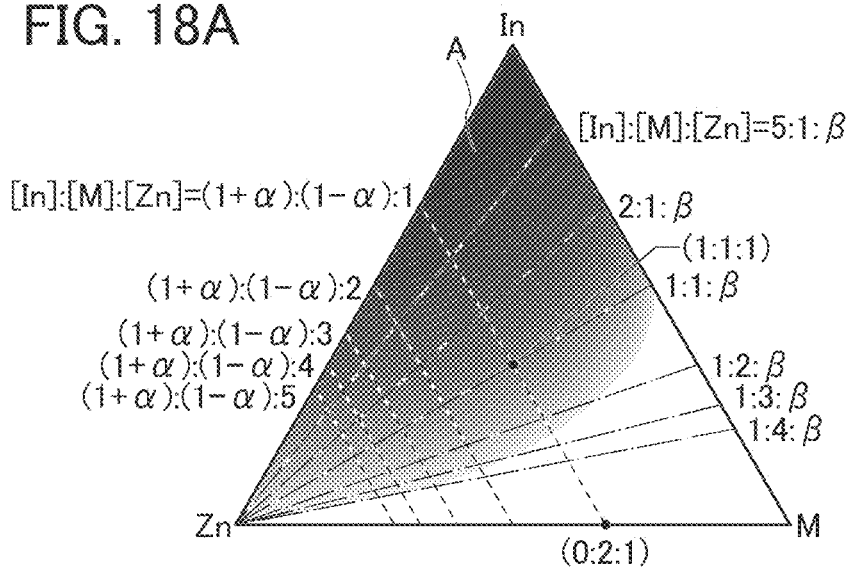
FIGS. 18A to 18C each illustrate an atomic ratio range of a metal oxide.
Figure 18B:
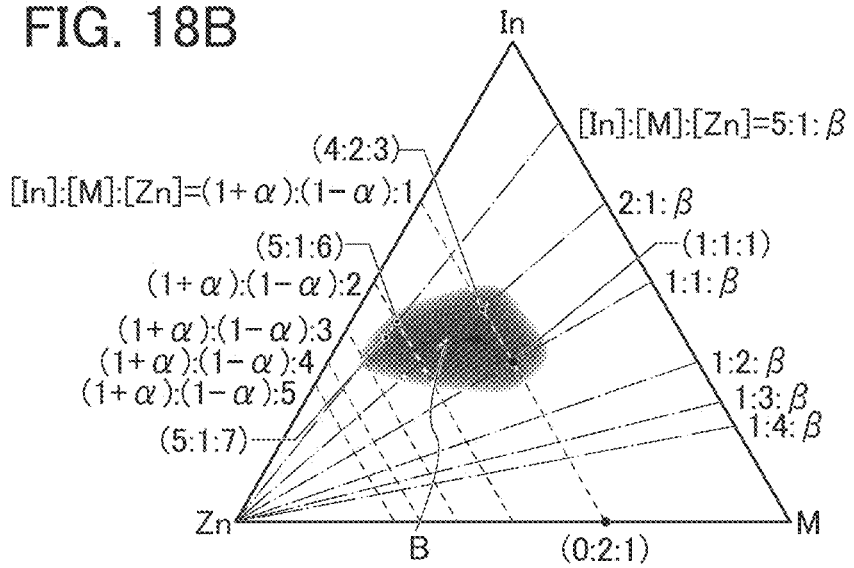
Figure 18C:
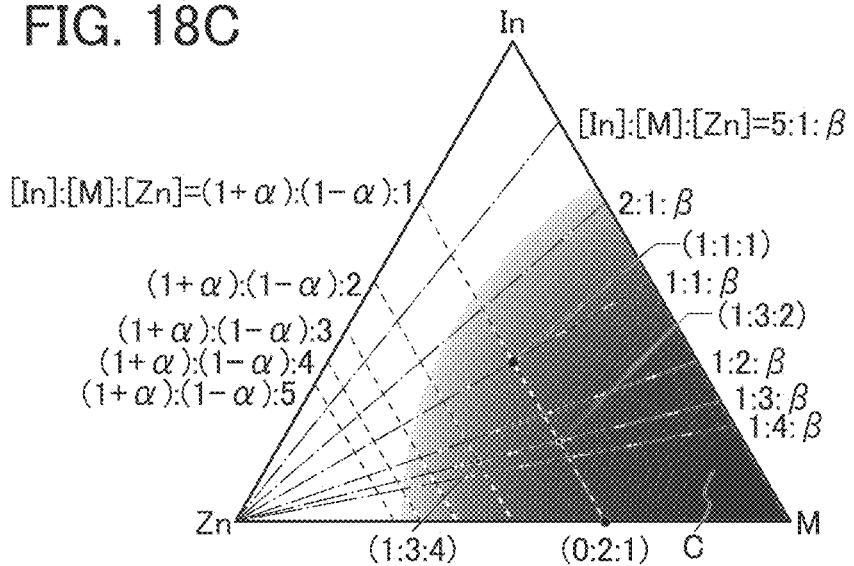

In FIGS. 18A to 18C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1\beta$, a line where the atomic ratio [In]:[M]:[Zn] is $1:1\beta$, a line where the atomic ratio [In]:[M]:[Zn] is $1:2\beta$, a line where the atomic ratio [In]:[M]:[Zn] is $1:3:\beta$, and a line where the atomic ratio [In]:[M]:[Zn] is $1:4:\beta$.

The metal oxides shown in FIGS. 18A to 18C with an atomic ratio of [In]:[M]:[Zn]=0:2:1 and the vicinity thereof are likely to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 18A shows an example of the preferred ranges of the atomic ratio of indium to the element M and zinc contained in the In-M-Zn oxide.

In addition, the metal oxide containing indium in a higher proportion can have high carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio [In]:[M]:[Zn] of 0:1:0 and the vicinity thereof (e.g., a region C in FIG. 18C), insulation performance becomes better.

For example, the metal oxide used as the second layer 121b preferably has an atomic ratio represented by the region A in FIG. 18A. The metal oxide with the atomic ratio has high carrier mobility. When M is Ga, for example, the atomic ratio [In]:[Ga]:[Zn] of the metal oxide used as the second layer 121b may be 4:2:3 to 4:2:4.1 or in the neighborhood thereof. In contrast, the metal oxide used as the first layer 121a preferably has an atomic ratio represented by the region C in FIG. 18C. The metal oxide with the atomic ratio has relatively high insulating properties. When M is Ga, for example, the atomic ratio [In]:[Ga]:[Zn] of the metal oxide used as the first layer 121a may be approximately 1:3:4.

A metal oxide having an atomic ratio in the region A, particularly in a region B in FIG. 18B, has high carrier mobility and high reliability and is excellent.

Note that the region B includes an atomic ratio of [In]:[M]:[Zn]=4:2:3 to 4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

It is preferable to use a target including a polycrystalline In-M-Zn oxide as the sputtering target. Note that the atomic ratio of the formed metal oxide varies from the above atomic ratios of metal elements of the sputtering targets in a range of ±40%. When M is Ga and the atomic ratio of the sputtering target is [In]:[Ga]:[Zn]=4:2:4.1, the atomic ratio [In]:[Ga]:[Zn] in the formed metal oxide may be 4:2:3 or in the neighborhood of 4:2:3. When M is Ga and the atomic ratio of the sputtering target is [In]:[Ga]:[Zn]=5:1:7, the atomic ratio [In]:[Ga]:[Zn] in the formed metal oxide may be 5:1:6 or in the neighborhood of 5:1:6. Note that the property of a metal oxide is not uniquely determined by an atomic ratio. Furthermore, the illustrated regions each represent an atomic ratio with which a metal oxide tends to have specific characteristics, and boundaries of the regions A to C are not clear.

<Composition of Metal Oxide>

The composition of cloud-aligned composite (CAC) metal oxide is described below.

CAC metal oxide has a conducting function in a part of the material and has an insulating function in another part of the material; as a whole, the CAC metal oxide has a function of a semiconductor. In the case where the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC metal oxide can have a switching function (on/off function). In the CAC metal oxide, separation of the functions can maximize each function.

The CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases. At the nanoparticle level, quantum effect is larger than at the macroscopic level and it is not possible to simply determine the conductive region and the insulating region, and in some cases it is necessary to evaluate the physical property of the combination thereof.

The CAC metal oxide includes components having different bandgaps. For example, the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC metal oxide is used in a channel region of a transistor, high current drive capability in the on state of the transistor, that is, high on-state current and high field-effect mobility, can be obtained.

In other words, the CAC metal oxide can be called a matrix composite or a metal matrix composite.

<Structure of Metal Oxide>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of the arrangement of oxygen atoms in an a-b plane direction, the interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. When the element M in the (M,Zn) layer is replaced with indium, the layer can also be referred to as an (In,M,Zn) layer. Also, when indium in the In layer is replaced with the element M, the layer can be referred to as an (In,M) layer.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure intermediate between those of the nc-OS and the amorphous oxide semiconductor. The a-like OS contains a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Metal Oxide>

Next, the case where the metal oxide is used for a transistor, particularly for a channel formation region, or an active layer, is described.

When the metal oxide is used in a transistor, the transistor can have high field-effect mobility. In addition, the transistor can have high reliability.

In the case of using the metal oxide for a transistor, the carrier density is preferably low in a channel formation region. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, the carrier density is lower than $8\times10^{11}/cm^3$, preferably lower than $1\times10^{11}/cm^3$, or further preferably lower than $1\times10^{10}/cm^3$, and greater than or equal to $1\times10^{-9}/cm^3$.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, the transistor whose channel region is formed in the oxide semiconductor having a high density of trap states has unstable electrical characteristics in some cases.

In order to obtain stable electrical characteristics of the oxide semiconductor transistor, it is effective to reduce the concentration of impurities in the channel. In addition, to reduce the concentration of impurities in the channel, the concentration of impurities in a film that is adjacent to the oxide semiconductor film is preferably reduced. As examples of the impurities, hydrogen, nitrogen, alkali metal, alkaline earth metal, iron, nickel, silicon, and the like are given.

<Impurities>

Here, the influence of impurities in the metal oxide is described.

When silicon or carbon that is one of Group 14 elements is contained in the metal oxide, defect states are formed. Thus, the concentration of silicon or carbon in the channel measured by SIMS is lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to be normally-on. Therefore, it is preferable to reduce the concentration of alkali metal or alkaline earth metal in the channel. Specifically, the concentration of alkali metal or alkaline earth metal in the channel measured by SIMS is lower than or equal to $1\times10^{18}$ atoms/cm$^3$, preferably lower than or equal to $2\times10^{16}$ atoms/cm$^3$.

When the oxide semiconductor contains nitrogen, the metal oxide easily becomes n-type by generation of electrons serving as carriers and an increase of carrier density. Thus, a transistor including the channel containing nitrogen is likely to be normally on. For this reason, nitrogen in the channel is preferably reduced as much as possible; for example, the concentration of nitrogen in the channel measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, and still more preferably lower than or equal to $5\times10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including the channel that contains much hydrogen is likely to be normally on. Accordingly, it is preferable to reduce hydrogen in the channel as much as possible. Specifically, the hydrogen concentration of the metal oxide measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

By sufficiently reducing impurities in the channel, the transistor can have stable electrical characteristics.

Embodiment 2

In this embodiment, application examples of the storage device using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computer refers to not only a tablet computer, a lap-top computer, and a desk-top computer, but also a large computer such as a server system. Alternatively, the semiconductor device described in the above embodiment is applied to removable storage devices such as memory cards (e.g., SD cards), USB memories, and solid state drives (SSD). FIGS. 19A to 19E schematically illustrate some structural examples of removable storage devices. A packaged memory chip including the semiconductor device described in the above embodiment is used in a variety of storage devices and removable memories, for example.

FIG. 19A is a schematic diagram of a USB memory. A USB memory 200 includes a housing 201, a cap 202, a USB connector 203, and a substrate 204. The substrate 204 is held in the housing 201. For example, the substrate 204 is provided with a memory chip 205 and a controller chip 206. The semiconductor device described in the above embodiment can be incorporated in the memory chip 205 or the like on the substrate 204.

FIG. 19B is a schematic external diagram of an SD card, and FIG. 19C is a schematic diagram illustrating the internal structure of the SD card. An SD card 210 includes a housing 211, a connector 212, and a substrate 213. The substrate 213 is held in the housing 211. For example, the substrate 213 is provided with a memory chip 214 and a controller chip 215. When the memory chip 214 is also provided on a back side of the substrate 213, the capacity of the SD card 210 can be increased. In addition, a wireless chip with a radio communication function may be provided on the substrate 213. With such a wireless chip, the memory chip 214 can read and write data by radio communication between the host device and the SD card 210. The semiconductor device described in the above embodiment can be incorporated in the memory chip 214 or the like on the substrate 213.

FIG. 19D is a schematic external diagram of an SSD, and FIG. 19E is a schematic diagram illustrating the internal structure of the SSD. An SSD 220 includes a housing 221, a connector 222, and a substrate 223. The substrate 223 is held in a housing 221. For example, the substrate 223 is provided with a memory chip 224, a memory chip 225, and a controller chip 226. The memory chip 225 is a work memory of the controller chip 226, and a DRAM chip may be used, for example. When the memory chip 224 is also provided on a back side of the substrate 223, the capacity of the SSD 220 can be increased. The semiconductor device described in the above embodiment can be incorporated in the memory chip 224 or the like on the substrate 223.

REFERENCE NUMERALS

CS: capacitor, MC: memory cell, PTr1: parasitic transistor, PTr2: parasitic transistor, RBL: read bit line, RTr: read transistor, RWL: read word line, WBL: write bit line, WTr: write transistor, WWL: write word line, 101: semiconductor wafer, 102: element isolation insulator, 103: transistor, 104: interlayer insulator, 105: contact plug, 106: insulator, 107: insulator, 108: first wiring, 109: capacitor insulating film, 110: memory node electrode, 111: insulator, 112: insulator, 113: second wiring, 114: memory cell layer, 115: insulator, 116: hole, 117: insulating film, 118: first semiconductor, 119: hole, 120: oxide film, 121: second semiconductor, 122: conductive region, 123: third wiring, 124: fourth wiring, 125: first semiconductor, 126: insulator, 127: second semiconductor, 128: insulator, 200: USB memory, 201: housing, 202: cap, 203: USB connector, 204: substrate, 205: memory chip, 206: controller chip, 210: SD card, 211: housing, 212: connector, 213: substrate, 214: memory chip, 215: controller chip, 220: SSD, 221: housing, 222: connector, 223: substrate, 224: memory chip, 225: memory chip, and 226: controller chip.

This application is based on Japanese Patent Application Serial No. 2016-224037 filed with Japan Patent Office on Nov. 17, 2016, the entire contents of which are hereby incorporated by reference.

The invention claimed is:

1. A semiconductor device comprising:
a first memory cell over a substrate; and
a second memory cell over the first memory cell,
wherein the first memory cell comprises a first transistor, a second transistor, and a first capacitor,
wherein the second memory cell comprises a third transistor, a fourth transistor, and a second capacitor,
wherein a gate of the first transistor is electrically connected to one of a source and a drain of the second transistor,
wherein the one of the source and the drain of the second transistor is electrically connected to one electrode of the first capacitor,
wherein a gate of the third transistor is electrically connected to one of a source and a drain of the fourth transistor,
wherein the one of the source and the drain of the fourth transistor is electrically connected to one electrode of the second capacitor,
wherein one of a source and a drain of the first transistor is electrically connected to one of a source and a drain of the third transistor,
wherein an axis in a channel length direction of the first transistor corresponds to an axis in a channel length direction of the third transistor, and
wherein an axis in a channel length direction of the second transistor corresponds to an axis in a channel length direction of the fourth transistor.

2. A semiconductor device comprising:
a first memory cell over a substrate; and
a second memory cell over the first memory cell,
wherein the first memory cell comprises a first transistor, a second transistor, and a first capacitor,
wherein the second memory cell comprises a third transistor, a fourth transistor, and a second capacitor,
wherein a gate of the first transistor is electrically connected to one of a source and a drain of the second transistor,
wherein the one of the source and the drain of the second transistor is electrically connected to one electrode of the first capacitor,
wherein a gate of the third transistor is electrically connected to one of a source and a drain of the fourth transistor,
wherein the one of the source and the drain of the fourth transistor is electrically connected to one electrode of the second capacitor,
wherein one of a source and a drain of the first transistor is electrically connected to one of a source and a drain of the third transistor, and
wherein channel length directions of the first transistor to the fourth transistor are each substantially perpendicular to a top surface of the substrate.

3. A semiconductor device comprising:
a first memory cell over a substrate; and
a second memory cell over the first memory cell,
wherein the first memory cell comprises a first transistor, a second transistor, and a first capacitor,
wherein the second memory cell comprises a third transistor, a fourth transistor, and a second capacitor,
wherein a gate of the first transistor is electrically connected to one of a source and a drain of the second transistor,
wherein the one of the source and the drain of the second transistor is electrically connected to one electrode of the first capacitor,
wherein a gate of the third transistor is electrically connected to one of a source and a drain of the fourth transistor,
wherein the one of the source and the drain of the fourth transistor is electrically connected to one electrode of the second capacitor,
wherein one of a source and a drain of the first transistor is electrically connected to one of a source and a drain of the third transistor,
wherein the semiconductor device comprises a first wiring serving as a gate of the second transistor,
wherein the semiconductor device comprises an electrode serving as the gate of the first transistor,
wherein the semiconductor device comprises a first semiconductor filling a first hole provided to penetrate the first wiring and the electrode,
wherein a first insulating film is provided between the first semiconductor and the first wiring, and
wherein the first semiconductor is electrically connected to the electrode.

4. The semiconductor device according to claim 3, further comprising an insulator between the first wiring and the electrode,
wherein the insulator has a physical property of releasing hydrogen by heating.

5. The semiconductor device according to claim 3,
wherein the electrode maintains surface conductivity under a condition where the first insulating film is provided.

6. The semiconductor device according to claim 3,
wherein the electrode is any one of
(1) a metal or an alloy that is less likely to be oxidized,
(2) a metal or an alloy whose oxide is conductive,
(3) a conductive metal oxide,
(4) a metal or an alloy whose oxide is more readily reduced than an oxide of the first wiring, and
(5) a conductive material that vaporizes when oxidized and does not form a compound with an insulating property on its surface.

7. The semiconductor device according to claim 3, further comprising a second wiring that faces the electrode with a second insulating film provided therebetween and extends in substantially the same direction as the first wiring,
wherein the first capacitor is formed by the electrode, the second wiring, and the second insulating film.

8. The semiconductor device according to claim 3,
wherein the first insulating film is an oxide formed by oxidation in a state where the first wiring is supplied with a potential different from that supplied to the electrode.

9. The semiconductor device according to claim 1,
wherein the second transistor and the fourth transistor each comprise a metal oxide.

10. The semiconductor device according to claim 2,
wherein the second transistor and the fourth transistor each comprise a metal oxide.

11. The semiconductor device according to claim 3,
wherein the second transistor and the fourth transistor each comprise a metal oxide.

12. A method for manufacturing a semiconductor device comprising the steps of:

stacking an electrode and a first wiring and forming a first hole penetrating the electrode and the first wiring;
forming a second hole penetrating the first wiring;
oxidizing a surface of the first wiring facing the first hole;
forming a first semiconductor in the first hole;
forming a third insulating film on a side surface of the electrode facing the second hole; and
forming a second semiconductor to overlap with the third insulating film.

* * * * *